US012809262B2

(12) United States Patent
Sato et al.

(10) Patent No.: US 12,809,262 B2
(45) Date of Patent: Nov. 24, 2026

(54) EXPOSURE METHOD OF PHOTOALIGNMENT LAYER

(71) Applicant: FUJIFILM Corporation, Tokyo (JP)

(72) Inventors: Hiroshi Sato, Minamiashigara (JP); Katsumi Sasata, Minamiashigara (JP); Takashi Yonemoto, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 558 days.

(21) Appl. No.: 18/485,071

(22) Filed: Oct. 11, 2023

(65) Prior Publication Data

US 2024/0045335 A1 Feb. 8, 2024

Related U.S. Application Data

(63) Continuation of application No. PCT/JP2022/017175, filed on Apr. 6, 2022.

(30) Foreign Application Priority Data

Apr. 12, 2021 (JP) ................................ 2021-067262

(51) Int. Cl.
*G03F 7/20* (2006.01)
*G02B 5/18* (2006.01)
(Continued)

(52) U.S. Cl.
CPC ................ *G03F 7/20* (2013.01); *G02B 5/18* (2013.01); *G02B 5/30* (2013.01); *G02F 1/1337* (2013.01)

(58) Field of Classification Search
CPC .... G03F 7/20; G02B 5/18; G02B 5/30; G02F 1/1337
See application file for complete search history.

(56) References Cited

U.S. PATENT DOCUMENTS

2010/0231847 A1 9/2010 Escuti
2016/0033698 A1 2/2016 Escuti et al.
(Continued)

FOREIGN PATENT DOCUMENTS

JP 5651753 B2 1/2015
JP 2017-522601 A 8/2017
(Continued)

OTHER PUBLICATIONS

WO2020022496A1 English translation (Year: 2020).*
(Continued)

*Primary Examiner* — Anne M Hines
(74) *Attorney, Agent, or Firm* — Birch, Stewart, Kolasch & Birch, LLP

(57) ABSTRACT

An object is to provide an exposure method of a photoalignment layer in which an alignment pattern having no disorder can be formed. The exposure method of a photoalignment layer includes an exposure step of disposing an exposure mask and a substrate that includes a coating film including a compound having a photo-aligned group such that the exposure mask and the coating film face each other, irradiating the coating film with light to which the compound is photosensitive from the exposure mask side, and exposing the coating film to form an alignment pattern, in which the light is circularly polarized light having an ellipticity of 0.7 to 1.3, the exposure mask is a polarization diffraction element having an alignment pattern where a direction of an optical axis changes while continuously rotating in at least one in-plane direction, in the exposure step, the coating film is exposed to zero-order light and first-order light of the light diffracted by the exposure mask, and an intensity ratio of the zero-order light to the first-order light is 0.5 to 2.

20 Claims, 8 Drawing Sheets

(51) Int. Cl.
*G02B 5/30* (2006.01)
*G02F 1/1337* (2006.01)

(56) References Cited

U.S. PATENT DOCUMENTS

| | | | | |
|---|---|---|---|---|
| 2017/0373459 | A1 | 12/2017 | Weng et al. | |
| 2021/0041610 | A1 | 2/2021 | Saitoh et al. | |
| 2021/0149098 | A1 | 5/2021 | Sasata et al. | |
| 2021/0208316 | A1 | 7/2021 | Sato et al. | |
| 2024/0045334 | A1* | 2/2024 | Sato | G02B 5/30 |
| 2024/0045335 | A1* | 2/2024 | Sato | G03F 7/20 |

FOREIGN PATENT DOCUMENTS

| | | | | |
|---|---|---|---|---|
| WO | WO 2014/181539 | A1 | 11/2014 | |
| WO | WO 2019/189675 | A1 | 10/2019 | |
| WO | WO-2020022496 | A1 * | 1/2020 | G02B 5/3083 |
| WO | WO 2020/066429 | A1 | 4/2020 | |

OTHER PUBLICATIONS

International Preliminary Report on Patentability and Written Opinion of the International Searching Authority (Forms PCT/IB/326, PCT/IB/373, and PCT/ISA/237) for International Application No. PCT/JP2022/017175, dated Oct. 26, 2023, with an English translation.

International Search Report (Form PCT/ISA/210) for International Application No. PCT/JP2022/017175, dated Jun. 28, 2022, with an English translation.

Japanese Office Action for corresponding Japanese Application No. 2023-514623, dated Sep. 9, 2025, with English translation.

* cited by examiner

EXPOSURE METHOD OF PHOTOALIGNMENT LAYER

CROSS-REFERENCE TO RELATED APPLICATIONS

This application is a Continuation of PCT International Application No. PCT/JP2022/017175 filed on Apr. 6, 2022, which claims priority under 35 U.S.C. § 119 (a) to Japanese Patent Application No. 2021-067262 filed on Apr. 12, 2021. The above applications are hereby expressly incorporated by reference, in their entirety, into the present application.

BACKGROUND OF THE INVENTION

1. Field of the Invention

The present invention relates to an exposure method of a photoalignment layer that is used for manufacturing a polarization diffraction element.

2. Description of the Related Art

A liquid crystal diffraction element that includes an optically-anisotropic layer where a liquid crystal compound is aligned with a liquid crystal alignment pattern where a direction of an optical axis derived from the liquid crystal compound continuously rotates in one in-plane direction is known.

The optically-anisotropic layer of the liquid crystal diffraction element is prepared, for example, by forming an alignment layer where an alignment pattern is formed on a substrate, applying a composition including a liquid crystal compound to the alignment layer, and drying the applied composition to align the liquid crystal compound.

As the alignment layer having the alignment pattern, a photoalignment layer is known. The photoalignment layer is formed by applying a coating material that includes a compound having a photo-aligned group to a substrate, drying the coating film to form a photosensitive coating film, and exposing the coating film to light corresponding to an alignment pattern to be formed.

During the formation of the alignment pattern of the photoalignment layer by the exposure, for example, two circularly polarized light components having opposite turning directions are superimposed to interfere with each other, and the interference light is incident into the photosensitive coating film to form an interference pattern on the coating film by interference fringes. By exposing the coating film to the interference light, the alignment pattern corresponding to the interference pattern is formed on the coating film to form the photoalignment layer.

The exposure of the photosensitive coating film is performed, for example, using an interference exposure device described below.

In the exposure device, a collimated laser beam is split into two linearly polarized light components orthogonal to each other by a polarization beam splitter. After focusing one of the linearly polarized light components using a convex lens, by causing one linearly polarized light to be incident into one surface of a half mirror and causing the other linearly polarized light to be incident into the other surface of the half mirror, the two linearly polarized light components are superimposed. Next, the superimposed two linearly polarized light components are converted into circularly polarized light components having different turning directions by a λ/4 wave plate. By causing the superimposed two circularly polarized light components to interfere with each other, the circularly polarized light incident into the coating film forms an interference pattern by interference fringes corresponding to a focal length of the convex lens and the like.

As a method of simply forming the alignment pattern on the photosensitive coating film without using the exposure device, a method of using the liquid crystal diffraction element that includes the optically-anisotropic layer having the liquid crystal alignment pattern as an exposure mask and exposing the coating film through this exposure mask is known.

With this exposure method, the alignment pattern corresponding to the liquid crystal alignment pattern of the liquid crystal diffraction element used as the exposure mask can be formed on the photosensitive coating film, that is, the photoalignment layer.

For example, JP5651753B discloses an exposure method (method of manufacturing an optical element) including: a step of photolithographically patterning an alignment surface using a birefringent mask having a holographic pattern therein to create an alignment state in the alignment surface based on the holographic pattern; and a step of forming a layer on the alignment surface such that directions of local optical axes of the layer are determined according to the alignment state in the alignment surface.

SUMMARY OF THE INVENTION

A specific example of the exposure method described in JP5651753B is conceptually shown in FIG. 12.

In this exposure method, a photosensitive coating film 104 that includes a compound having a photo-aligned group is formed on a surface of a substrate 106, the liquid crystal diffraction element is used as an exposure mask 100, and the coating film 104 is irradiated with light (linearly polarized light Lp) emitted from a light source 102 through the exposure mask 100.

As a result, the coating film 104 is exposed to the liquid crystal alignment pattern of the liquid crystal diffraction element that is the exposure mask 100 to form a photoalignment layer where an alignment pattern corresponding to the liquid crystal alignment pattern is formed.

For example, as conceptually shown in FIG. 13, the liquid crystal diffraction element used as the exposure mask 100 has a liquid crystal alignment pattern where a direction of a liquid crystal compound 30 continuously rotates in one in-plane direction.

In FIG. 13, for example, a rod-like liquid crystal compound is used as the liquid crystal compound 30. Therefore, the optical axis matches with a longitudinal direction of the liquid crystal compound 30.

In JP5651753B, the exposure mask 100 is designed such that Δn×d that is the product of a difference Δn in refractive index of the liquid crystal compound forming the optically-anisotropic layer of the liquid crystal diffraction element and a thickness d of the optically-anisotropic layer is λ/2 wavelength (λ/2) with respect to a wavelength λ of incidence light.

In a case where the linearly polarized light Lp is incident into the exposure mask 100, as conceptually shown in FIG. 14, the linearly polarized light Lp is diffracted and split into circularly polarized light +Cp as positive first-order light and circularly polarized light-Cp as negative first-order light.

Here, in the circularly polarized light +Cp as the positive first-order light and the circularly polarized light-Cp as the negative first-order light, the wavelengths are the same as each other and the turning directions of the circularly polarized light components are opposite to each other. Therefore, the circularly polarized light +Cp and the circularly polarized light −Cp adjacent to each other interfere with each other to form an interference pattern (interference fringes) on the coating film 104.

As a result, an interference pattern having the same alignment pattern as the liquid crystal alignment pattern of the liquid crystal diffraction element that is the exposure mask 100 and having a diffraction period of λ/2 is formed on the coating film 104. By exposing the coating film 104 to the interference pattern, the alignment pattern corresponding to the liquid crystal alignment pattern of the liquid crystal diffraction element is formed on the coating film 104.

Here, according to an investigation by the present inventors, it was found that, in the exposure method in the related art where the liquid crystal diffraction element is used as the exposure mask, zero-order light indicated by a broken line in FIG. 14, that is, the linearly polarized light Lp that transmits through the exposure mask 100 as it is is unavoidably incident into the coating film 104.

The zero-order light is noise to which the coating film 104 is unnecessarily exposed. Therefore, the formed alignment pattern may be disordered.

In particular, in a case where the pitch of the alignment pattern of the exposure mask 100, that is, the diffraction period is short, the amount of zero-order light increases, and the disorder of the alignment pattern by the noise may increase.

An object of the present invention is to solve the above-described problem of the related art and to provide a simple exposure method of a photoalignment layer using an exposure mask, in which a photoalignment layer that has an alignment pattern having no disorder can be formed.

In order to achieve the object, the present invention has the following configurations.

[1] An exposure method of a photoalignment layer, the exposure method comprising:

an exposure step of disposing an exposure mask and a substrate that includes a coating film including a compound having a photo-aligned group such that the exposure mask and the coating film face each other, irradiating the coating film with light to which the compound is photosensitive from the exposure mask side, and exposing the coating film to form an alignment pattern, in which the light is circularly polarized light having an ellipticity of 0.7 to 1.3, the exposure mask is a polarization diffraction element having an alignment pattern where a direction of an optical axis changes while continuously rotating in at least one in-plane direction, in the exposure step, the coating film is exposed to zero-order light and first-order light of the light diffracted by the exposure mask, and an intensity ratio of the zero-order light to the first-order light is 0.5 to 2.

[2] The exposure method of a photoalignment layer according to [1], in which the zero-order light and the first-order light are circularly polarized light components having an ellipticity of 0.6 to 2, and the zero-order light and the first-order light are circularly polarized light components having opposite turning directions.

[3] The exposure method of a photoalignment layer according to [1] or [2], in which in the alignment pattern, in a case where a length over which the direction of the optical axis rotates by 180° in one in-plane direction is set as a single period, each of the exposure mask and the coating film to which the exposure step is applied has a region where a ratio of a length of the single period of the coating film to a length of the single period of the exposure mask is 0.7 to 1.5.

[4] The exposure method of a photoalignment layer according to any one of [1] to [3], in which in the alignment pattern of the exposure mask, in a case where a length over which the direction of the optical axis rotates by 180° in a plane is set as a single period, the coating film to which the exposure step is applied has a region where the single period is 5 μm or less.

[5] The exposure method of a photoalignment layer according to any one of [1] to [4], in which the exposure mask is a liquid crystal diffraction element including an optically-anisotropic layer that is formed of a liquid crystal composition including a liquid crystal compound, and the optically-anisotropic layer has a liquid crystal alignment pattern in which a direction of an optical axis derived from the liquid crystal compound changes while continuously rotating in at least one in-plane direction.

[6] The exposure method of a photoalignment layer according to [5], in which in an image obtained by observing a cross of the optically-anisotropic layer taken in a thickness direction along the one in-plane direction with a scanning electron microscope, the optically-anisotropic layer has a bright portion and a dark portion extending from one main surface to another main surface, and has a region where the dark portion is tilted with respect to a main surface.

[7] The exposure method of a photoalignment layer according to [6], in which the optically-anisotropic layer has a region where an angle of the dark portion with respect to a perpendicular direction of a main surface of the optically-anisotropic layer varies in the thickness direction of the optically-anisotropic layer.

[8] The exposure method of a photoalignment layer according to [6] or [7], in which in the optically-anisotropic layer, the dark portion has one or more inflection points of angle.

[9] The exposure method of a photoalignment layer according to [8], in which the dark portion has two or more inflection points of angle.

[10] The exposure method of a photoalignment layer according to any one of [6] to [9], in which in a case where a length over which the direction of the optical axis rotates by 180° in one in-plane direction is set as a single period, the optically-anisotropic layer has a region where the single period decreases in the one in-plane direction in the liquid crystal alignment pattern, and the optically-anisotropic layer has a region where an angle of the dark portion with respect to a perpendicular direction of a main surface increases as the single period decreases.

[11] The exposure method of a photoalignment layer according to any one of [6] to [10], in which the optically-anisotropic layer has a region where shapes of the bright portion and the dark portion are symmetrical with respect to a center line in the thickness direction.

[12] The exposure method of a photoalignment layer according to any one of [6] to [11], in which the optically-anisotropic layer has a region where shapes of the bright portion and the dark portion are asymmetrical with respect to a center line in the thickness direction.

[13] The exposure method of a photoalignment layer according to any one of [1] to [12], in which the alignment pattern of the exposure mask is a pattern where the one in-plane direction in which the direction of the optical axis changes while continuously rotating in the at least one in-plane direction is provided in a radial shape from a center toward an outer side.

[14] A photoalignment layer which is manufactured using the exposure method of a photoalignment layer according to any one of [1] to [13].

With the exposure method of a photoalignment layer according to the present invention that is a simple exposure method of a photoalignment layer using an exposure mask, a photoalignment layer that has an alignment pattern having no disorder can be formed.

DESCRIPTION OF THE PREFERRED EMBODIMENTS

Hereinafter, an exposure method of a photoalignment layer according to an embodiment of the present invention will be described in detail based on preferable embodiments shown in the accompanying drawings.

The following description regarding configuration requirements has been made based on a representative embodiment of the present invention. However, the present invention is not limited to the embodiment.

Further, all the drawings described below are conceptual views for describing the present invention. A size, a thickness, a positional relationship, and the like of each of members, portions, and the like do not necessarily match with the actual ones.

In the present specification, numerical ranges represented by "to" include numerical values before and after "to" as lower limit values and upper limit values.

Figure 1:
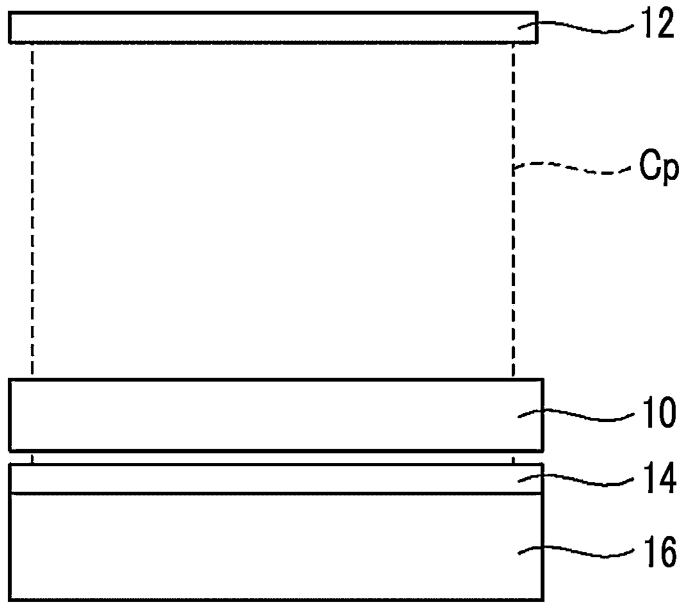
FIG. 1 is a diagram conceptually showing an example of an exposure method of a photoalignment layer according to the present invention.

FIG. 1 conceptually shows an example of an exposure device that implements the exposure method of a photoalignment layer according to the embodiment of the present invention.

In the following description, "the exposure method of a photoalignment layer according to the embodiment of the present invention" will also be referred to as "the exposure method according to the embodiment of the present invention".

As shown in FIG. 1, in the exposure method according to the embodiment of the present invention, a coating film 14 formed on a surface of a substrate 16 is irradiated with light (circularly polarized light Cp) that is emitted from a light source 12 and diffracted by an exposure mask 10.

As the exposure device that implements the exposure method according to the embodiment of the present invention, various well-known exposure devices can be used. For example, an exposure device that performs proximity exposure, an exposure device using a laser light source, or an exposure device using a collimated light source is suitably used. The substrate 16 is the same as a support 20 of the exposure mask 10 described below.

In addition, the coating film 14 is the same as a coating film that forms a photoalignment layer in an alignment layer 24 of the exposure mask 10 described below. That is, the coating film 14 is obtained by applying a coating material that includes a compound having a photo-aligned group to the surface of the substrate 16 and drying the applied coating material. In the following description, "the compound having a photo-aligned group" will also be referred to as "photo-alignment material".

The light source 12 emits light having a wavelength to which the photo-alignment material in the coating film 14 is photosensitive.

The exposure mask 10 is a polarization diffraction element having an alignment pattern where a direction of an optical axis changes while continuously rotating in at least one in-plane direction.

In the example shown in the drawing, the exposure mask 10 is a liquid crystal diffraction element including an optically-anisotropic layer that is formed of a composition including a liquid crystal compound. The optically-anisotropic layer has a liquid crystal alignment pattern in which a direction of an optical axis derived from the liquid crystal compound changes while continuously rotating in at least one in-plane direction.

Although described below in detail, in the exposure method according to the embodiment of the present invention, the coating film 14 is irradiated with the light emitted from the light source 12 through the exposure mask 10. As a result, the photo-alignment material in the coating film 14 is aligned to form the same alignment pattern as the liquid crystal alignment pattern in the exposure mask 10, that is, the liquid crystal diffraction element (optically-anisotropic layer) on the coating film 14.

In the exposure method according to the embodiment of the present invention, the light source 12 emits circularly polarized light having an ellipticity of 0.7 to 1.3 to the exposure mask 10. That is, in the present invention, circularly polarized light forming a substantially perfect circle is incident into the exposure mask.

In a case where the ellipticity of the light emitted to the exposure mask 10 exceeds 0.7 to 1.3, a problem such as the disorder of the alignment pattern formed on the coating film 14 (photoalignment layer) or a decrease in alignment restriction force of the coating film 14 (photoalignment layer) occurs.

The ellipticity of the light emitted to the exposure mask 10 is preferably 0.8 to 1.2 and more preferably 0.9 to 1.1.

As the light source 12, various well-known light irradiation units can be used as long as they can emit parallel light having an ellipticity in the above-described range and coherency.

Examples of the light source 12 include a laser light source that emits an unpolarized laser beam having diffusibility, a light source where a circularly polarizing plate and a collimator lens are combined, a laser light source that emits an unpolarized and collimated laser beam, a light source that is combined with a circularly polarizing plate, a laser light source that emits a linearly polarized laser beam having diffusibility, a light source where a λ/4 wave plate and a collimator lens are combined, a laser light source that emits a collimated and linearly polarized laser beam, and a light source that is combined with a λ/4 wave plate.

As the light source 12, various well-known light irradiation units can be used as long as they can emit parallel light having an ellipticity in the above-described range and coherency such that the alignment pattern can be formed on the coating film 14 after passing through the exposure mask 10.

Examples of the light source 12 include an exposure light source that performs proximity exposure, a light source that is combined with a circularly polarizing plate, a mercury light source, a light source where a collimator lens and a circularly polarizing plate are combined, and a light source where an LED light source, a collimator lens, and a circularly polarizing plate are combined.

Figure 2:
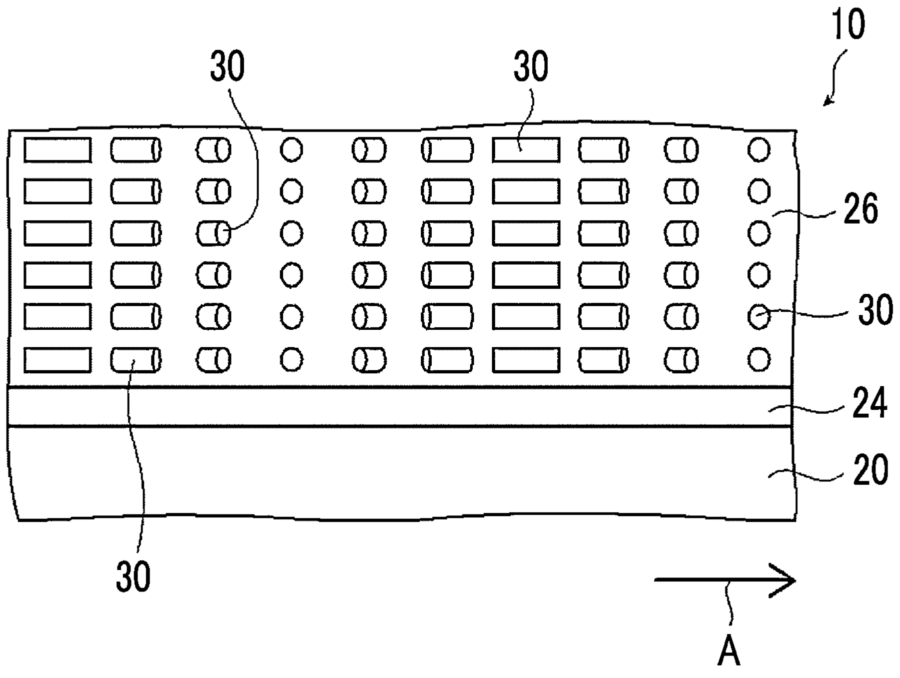
FIG. 2 is a diagram conceptually showing an example of an exposure mask.

FIG. 2 conceptually shows an example of the exposure mask 10.

The exposure mask 10 shown in FIG. 2 is, for example, a liquid crystal diffraction element including the support 20, the alignment layer 24, and an optically-anisotropic layer 26. As described above, the optically-anisotropic layer 26 is formed of a composition including a liquid crystal compound, and has a liquid crystal alignment pattern in which a direction of an optical axis derived from the liquid crystal compound changes while continuously rotating in at least one in-plane direction.

In the exposure method according to the embodiment of the present invention, the exposure mask 10 is not limited to the configuration shown in FIG. 2. For example, the exposure mask may consist of the optically-anisotropic layer 26 and the alignment layer 24 by peeling off the support 20 from the exposure mask 10 shown in FIG. 2, or may consist of only the optically-anisotropic layer 26 by peeling off the support 20 and the alignment layer 24 from the exposure mask 10. Alternatively, the exposure mask may be obtained by bonding another support to the optically-anisotropic layer 26.

<<Support>>

In the exposure mask 10, the support 20 supports the alignment layer 24 and the optically-anisotropic layer 26.

As the support 20, various sheet-shaped materials (films or plate-shaped materials) can be used as long as they can support the alignment layer 24 and the optically-anisotropic layer 26.

As the support 20, a transparent support is preferable, and examples thereof include a polyacrylic resin film such as polymethyl methacrylate, a cellulose resin film such as cellulose triacetate, a cycloolefin polymer film (for example, trade name "ARTON", manufactured by JSR Corporation; or trade name "ZEONOR", manufactured by Zeon Corporation), polyethylene terephthalate (PET), polycarbonate, and polyvinyl chloride. The support is not limited to a flexible film and may be a non-flexible substrate such as a glass substrate.

The thickness of the support 20 is not particularly limited and may be appropriately set depending on the use of the exposure mask 10, a material for forming the support 20, and the like in a range where the alignment layer and the optically-anisotropic layer can be supported.

The thickness of the support 20 is preferably 1 to 2000 μm, more preferably 3 to 500 μm, and still more preferably 5 to 150 μm.

<<Alignment Layer>>

In the exposure mask 10, the alignment layer 24 is formed on a surface of the support 20.

The alignment layer 24 is an alignment layer for aligning the liquid crystal compound 30 to the predetermined liquid crystal alignment pattern during the formation of the optically-anisotropic layer 26 of the exposure mask 10 that is the liquid crystal diffraction element.

In FIG. 2 or the like, a rod-like liquid crystal compound is shown as the liquid crystal compound 30.

Figure 3:
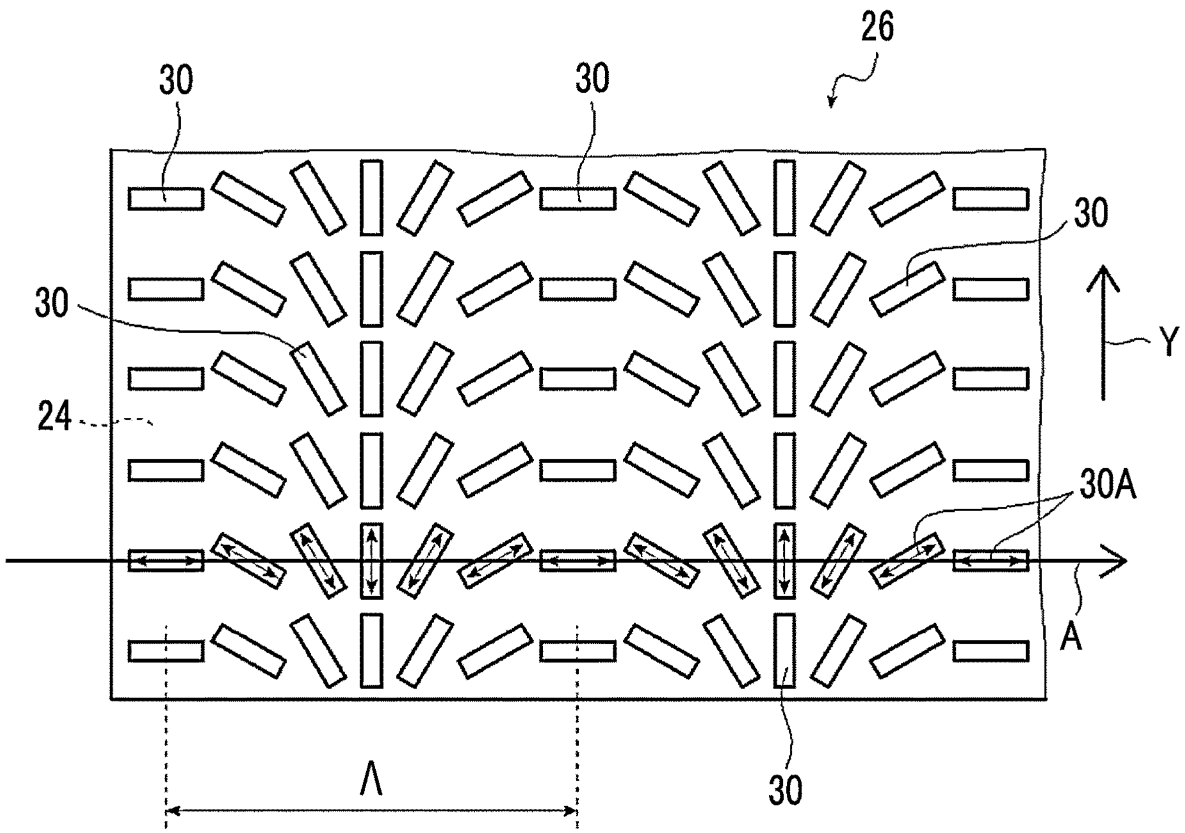
FIG. 3 is a schematic plan view showing one example of an optically-anisotropic layer.

As described above, in the transmissive exposure mask 10 in the example shown in the drawing, for example, as shown in FIG. 3, the optically-anisotropic layer 26 has a liquid crystal alignment pattern in which a direction of an optical axis 30A derived from the liquid crystal compound 30 changes while continuously rotating in one in-plane direction (in the drawing, an arrow A direction).

Accordingly, the alignment layer 24 of the exposure mask 10 is formed such that the optically-anisotropic layer 26 forms the liquid crystal alignment pattern.

In addition, in the present invention, in a case where the liquid crystal compound 30 is a rod-like liquid crystal compound, the optical axis 30A of the liquid crystal compound 30 refers to a molecular major axis of the rod-like liquid crystal compound. On the other hand, in a case where the liquid crystal compound 30 is a disk-like liquid crystal compound, the optical axis 30A of the liquid crystal compound 30 refers to an axis parallel to the normal direction (vertical direction) with respect to a disk plane of the disk-like liquid crystal compound.

In the following description, "the direction of the optical axis 30A rotates" will also be simply referred to as "the optical axis 30A rotates".

As the alignment layer 24, various well-known films can be used.

Examples of the alignment layer include a rubbed film formed of an organic compound such as a polymer, an obliquely deposited film formed of an inorganic compound, a film having a microgroove, and a film formed by lamination of Langmuir-Blodgett (LB) films formed with a Langmuir-Blodgett's method using an organic compound such as @-tricosanoic acid, dioctadecylmethylammonium chloride, or methyl stearate.

The alignment layer formed by a rubbing treatment can be formed by rubbing a surface of a polymer layer with paper or fabric in a given direction multiple times.

As the material used for the alignment layer, for example, a material for forming polyimide, polyvinyl alcohol, a polymer having a polymerizable group described in JP1997-152509A (JP-H9-152509A), or an alignment layer such as JP2005-97377A, JP2005-99228A, and JP2005-128503A is preferable.

In the exposure mask 10, the alignment layer is suitably used as a so-called photoalignment layer obtained by irradiating the photo-alignment material with polarized light or non-polarized light.

That is, in the exposure mask 10, as the alignment layer 24, a photoalignment layer obtained by applying a coating material including the photo-alignment material to the support 20, drying the coating material to form a coating film, and irradiating the coating film with light corresponding to the alignment pattern for alignment is suitably used. "The photo-alignment material" refers to "a compound having a photo-aligned group" as described above.

Preferable examples of the photo-alignment material include: an azo compound described in JP2006-285197A, JP2007-76839A, JP2007-138138A, JP2007-94071A, JP2007-121721A, JP2007-140465A, JP2007-156439A, JP2007-133184A, JP2009-109831A, JP3883848B, and JP4151746B; an aromatic ester compound described in JP2002-229039A; a maleimide- and/or alkenyl-substituted nadiimide compound having a photo-alignable unit described in JP2002-265541A and JP2002-317013A; a photocrosslinking silane derivative described in JP4205195B and JP4205198B, a photocrosslinking polyimide, a photocrosslinking polyamide, or a photocrosslinking ester described in JP2003-520878A, JP2004-529220A, and JP4162850B; and a photodimerizable compound, in particular, a cinnamate (cinnamic acid) compound, a chalcone compound, or a coumarin compound described in JP1997-118717A (JP-H9-118717A), JP1998-506420A (JP-H10-506420A), JP2003-505561A, WO2010/150748A, JP2013-177561A, and JP2014-12823A.

Among these, an azo compound, a photocrosslinking polyimide, a photocrosslinking polyamide, a photocrosslinking ester, a cinnamate compound, or a chalcone compound is suitably used.

The thickness of the alignment layer 24 is not particularly limited. The thickness with which a required alignment function can be obtained may be appropriately set depending on the material for forming the alignment layer 24. The thickness of the alignment layer 24 is preferably 0.01 to 5 μm and more preferably 0.02 to 2 μm.

A method of forming the alignment layer 24 is not limited. Any one of various well-known methods corresponding to a material for forming the alignment layer can be used.

For example, the following method can be used. The coating material including the photo-alignment material is applied to the surface of the support 20 and is dried to form a coating film. Next, the coating film is exposed to a laser beam to form an alignment pattern. As a result, a photoalignment layer is obtained.

Figure 5:
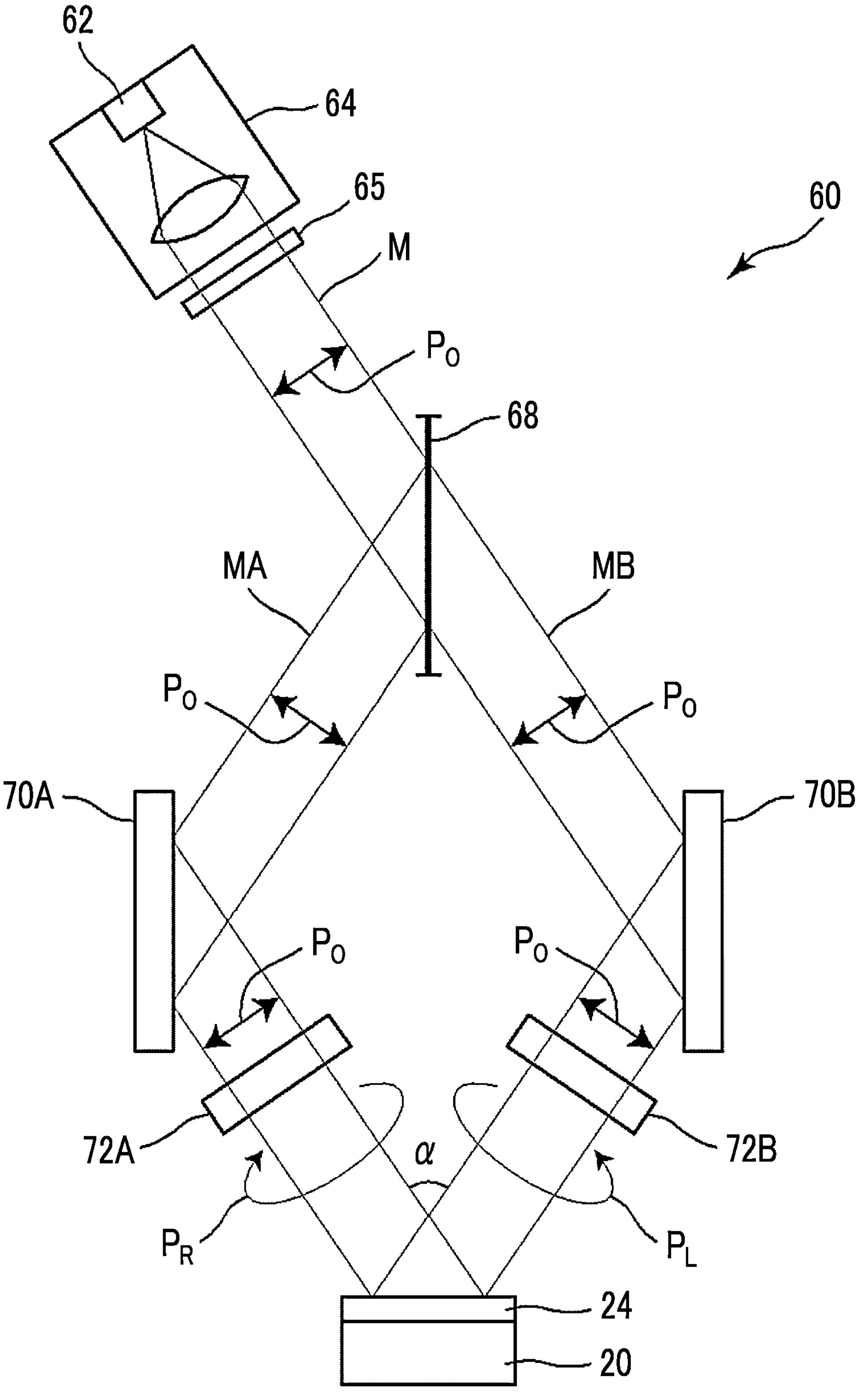
FIG. 5 is a diagram conceptually showing an example of an exposure device of a coating film.

FIG. 5 conceptually shows an example of an exposure device that exposes the alignment layer 24 to form the above-described alignment pattern.

An exposure device 60 shown in FIG. 5 includes: a light source 64 including a laser 62; an λ/2 plate 65 that changes a polarization direction of laser light M emitted from the laser 62; a polarization beam splitter 68 that splits the laser light M emitted from the laser 62 into two beams MA and MB; mirrors 70A and 70B that are disposed on optical paths of the split two beams MA and MB; and λ/4 plates 72A and 72B.

The light source 64 emits linearly polarized light $P_0$. The λ/4 plate 72A converts the linearly polarized light $P_0$ (beam MA) into right circularly polarized light PR, and the λ/4 plate 72B converts the linearly polarized light $P_0$ (beam MB) into left circularly polarized light $P_L$.

The support 20 including the alignment layer 24 on which the alignment pattern is not yet formed is disposed at an exposed portion, the two beams MA and MB intersect and interfere each other on the alignment layer 24, and the alignment layer 24 is irradiated with and exposed to the interference light.

Due to the interference in this case, the polarization state of light with which the alignment layer 24 is irradiated periodically changes according to interference fringes. As a result, an alignment layer (hereinafter, also referred to as "patterned alignment layer") having an alignment pattern in which the alignment state changes periodically is obtained.

In the exposure device 60, by changing an intersecting angle α between the two beams MA and MB, the period of the alignment pattern can be adjusted. That is, by adjusting the intersecting angle α in the exposure device 60, in the alignment pattern in which the optical axis 30A derived from the liquid crystal compound 30 continuously rotates in the one in-plane direction, the length (single period Λ described below) of the single period over which the optical axis 30A rotates by 180° in the one in-plane direction in which the optical axis 30A rotates can be adjusted.

By forming the optically-anisotropic layer 26 on the alignment layer 24 having the alignment pattern in which the alignment state periodically changes, as described below, the optically-anisotropic layer 26 having the liquid crystal alignment pattern in which the optical axis 30A derived from the liquid crystal compound 30 continuously rotates in the one in-plane direction can be formed.

In addition, by rotating the optical axes of the λ/4 plates 72A and 72B by 90°, respectively, the rotation direction of the optical axis 30A can be reversed.

As described above, the patterned alignment layer has an alignment pattern to obtain the liquid crystal alignment pattern in which the liquid crystal compound is aligned such that the direction of the optical axis of the liquid crystal compound in the optically-anisotropic layer 26 formed on the patterned alignment layer changes while continuously rotating in at least one in-plane direction.

In a case where an axis in the direction in which the liquid crystal compound is aligned is an alignment axis, it can be said that the patterned alignment layer has an alignment pattern in which the direction of the alignment axis changes while continuously rotating in at least one in-plane direction.

The alignment axis of the patterned alignment layer can be detected by measuring absorption anisotropy. For example, in a case where the amount of light transmitted through the patterned alignment layer is measured by irradiating the patterned alignment layer with linearly polarized light while rotating the patterned alignment layer, it is observed that a direction in which the light amount is the maximum or the minimum gradually changes in the one in-plane direction.

In the exposure mask 10, the alignment layer 24 is provided as a preferable aspect and, as described above, is not a configuration requirement.

For example, the following configuration can also be adopted, in which, by forming the alignment pattern on the support 20 using a method of rubbing the support 20, a method of processing the support 20 with laser light or the like, or the like, the optically-anisotropic layer 26 or the like as the liquid crystal alignment pattern in which the direction of the optical axis 30A derived from the liquid crystal compound 30 changes while continuously rotating in the one in-plane direction.

<<Optically-Anisotropic Layer>>

In the exposure mask 10 shown in FIG. 2, the optically-anisotropic layer 26 is formed on the surface of the alignment layer 24.

As described above, in the exposure mask 10 that is the liquid crystal diffraction element, the optically-anisotropic layer 26 is formed of a composition including a liquid crystal compound.

The optically-anisotropic layer 26 has the liquid crystal alignment pattern where the direction of the optical axis 30A derived from the liquid crystal compound 30 changes while continuously rotating in one in-plane direction (the arrow A direction in FIG. 3 or the like) of the optically-anisotropic layer.

The optical axis 30A derived from the liquid crystal compound 30 is an axis having the highest refractive index in the liquid crystal compound 30, that is, a so-called slow axis. For example, in a case where the liquid crystal compound 30 is a rod-like liquid crystal compound, the optical axis 30A is along a rod-like major axis direction.

In the following description, the optical axis 30A derived from the liquid crystal compound 30 will also be referred to as "the optical axis 30A of the liquid crystal compound 30" or "the optical axis 30A"

FIG. 3 is a schematic diagram showing an alignment state of the liquid crystal compound 30 in a plane of a main surface of the optically-anisotropic layer 26. The main surface is the maximum surface of a sheet-shaped material (a film, a plate-shaped material, or a layer).

As described above, the optically-anisotropic layer 26 has the liquid crystal alignment pattern where the optical axis 30A changes while continuously rotating in the one in-plane direction indicated by the arrow A.

In the optically-anisotropic layer 26, the liquid crystal compound 30 is two-dimensionally arranged in a plane along the one in-plane direction indicated by the arrow A and a Y direction orthogonal to the arrow A direction.

In the following description, "one direction indicated by the arrow A" will also be simply referred to as "arrow A direction".

The plan view is a view in a case where the optically-anisotropic layer 26 is seen from a thickness direction (laminating direction of the respective layers (films)). In other words, the plan view is a view in a case where the optically-anisotropic layer 26 is seen from a direction orthogonal to a main surface.

In addition, in FIG. 3, in order to clearly show the configuration of the exposure mask 10, only the liquid crystal compound 30 on the surface of the alignment layer 24 is shown. However, in the thickness direction, as shown in FIG. 2, the optically-anisotropic layer 26 has the structure in which the liquid crystal compound 30 is laminated on the liquid crystal compound 30 of the surface of the alignment layer.

The optically-anisotropic layer 26 has the liquid crystal alignment pattern in which the direction of the optical axis 30A derived from the liquid crystal compound 30 changes while continuously rotating in the arrow A direction in a plane of the optically-anisotropic layer 26.

Specifically, "the direction of the optical axis 30A of the liquid crystal compound 30 changes while continuously rotating in the arrow A direction (the predetermined one direction)" represents that an angle between the optical axis 30A of the liquid crystal compound 30, which is arranged in the arrow A direction, and the arrow A direction varies depending on positions in the arrow A direction, and the angle between the optical axis 30A and the arrow A direction sequentially changes from θ to θ+180° or θ−180° in the arrow A direction.

A difference between the angles of the optical axes 30A of the liquid crystal compound 30 adjacent to each other in the arrow. A direction is preferably 45° or less, more preferably 15° or less, and still more preferably less than 15°.

On the other hand, regarding the liquid crystal compound 30 forming the optically-anisotropic layer 26, the liquid crystal compounds 30 having the same direction of the optical axes 30A are arranged at regular intervals in the Y direction orthogonal to the arrow A direction, that is, the Y direction orthogonal to the one in-plane direction in which the optical axis 30A continuously rotates.

In other words, regarding the liquid crystal compound 30 forming the optically-anisotropic layer 26, in the liquid crystal compounds 30 arranged in the Y direction, angles between the directions of the optical axes 30A and the arrow A direction are the same.

The optically-anisotropic layer 26 is formed of a liquid crystal composition including a rod-like liquid crystal compound or a disk-like liquid crystal compound, and has a liquid crystal alignment pattern in which an optical axis of the rod-like liquid crystal compound or an optical axis of the disk-like liquid crystal compound is aligned as described above.

By forming the alignment layer 24 having the alignment pattern corresponding to the above-described liquid crystal alignment pattern on the support 20 and applying the liquid crystal composition to the alignment layer 24, and curing the applied liquid crystal composition, the optically-anisotropic layer formed of the cured layer of the liquid crystal composition can be obtained. For the application of the liquid crystal composition, application of multiple layers shown below in Examples can be suitably used.

In addition, the liquid crystal composition for forming the optically-anisotropic layer 26 includes a rod-like liquid crystal compound or a disk-like liquid crystal compound and may further include other components such as a leveling agent, an alignment control agent, a surfactant, a polymerization initiator, a crosslinking agent, or an alignment assistant.

In addition, it is preferable that the optically-anisotropic layer 26 has a wide range for the wavelength of incidence light and is formed of a liquid crystal material having a reverse birefringence index dispersion. In addition, it is also preferable that the optically-anisotropic layer can be made to have a substantially wide range for the wavelength of incidence light by imparting a twist. component to the liquid crystal composition or by laminating different retardation layers. For example, in the optically-anisotropic layer 26, a method of realizing a λ/2 plate having a wide-range pattern by laminating two liquid crystal layers having different twisted directions is disclosed in, for example, JP2014-089476A and can be preferably used in the present invention.

—Rod-Like Liquid Crystal Compound—

As the rod-like liquid crystal compound, an azomethine compound, an azoxy compound, a cyanobiphenyl compound, a cyanophenyl ester compound, a benzoate compound, a phenyl cyclohexanecarboxylate compound, a cyanophenylcyclohexane compound, a cyano-substituted phenylpyrimidine compound, an alkoxy-substituted phenylpyrimidine compound, a phenyldioxane compound, a tolan compound, or an alkenylcyclohexylbenzonitrile compound is preferably used. As the rod-like liquid crystal compound, not only the above-described low molecular weight liquid crystal molecules but also high molecular weight liquid crystal molecules can be used.

In the optically-anisotropic layer 26, it is more preferable that the alignment of the rod-like liquid crystal compound is immobilized by polymerization. Examples of the polymerizable rod-like liquid crystal compound include compounds described in Makromol. Chem., (1989), Vol. 190, p. 2255, Advanced Materials (1993), Vol. 5, p. 107, U.S. Pat. Nos. 4,683,327A, 5,622,648A, 5,770,107A, WO95/22586A, WO95/24455A, WO97/00600A, WO98/23580A, WO98/52905A, JP1989-272551A (JP-H1-272551A), JP1994-16616A (JP-H6-16616A), JP1995-110469A (JP-H7-110469A), JP1999-80081A (JP-H11-80081A), and JP2001-328973.

Further, as the rod-like liquid crystal compound, for example, compounds described in JP1999-513019A (JP-H11-513019A) and JP2007-279688A can also be preferably used.

—Disk-Like Liquid Crystal Compound—

As the disk-like liquid crystal compound, for example, compounds described in JP2007-108732A and JP2010-244038A can be preferably used.

In a case where the disk-like liquid crystal compound is used in the optically-anisotropic layer, the liquid crystal compound 30 rises in the thickness direction in the optically-anisotropic layer, and the optical axis 30A derived from the liquid crystal compound is defined as an axis perpendicular to a disk plane, that is so-called, a fast axis.

As described above, the optically-anisotropic layer 26 of the exposure mask 10 has the liquid crystal alignment pattern where the optical axis 30A derived from the liquid crystal compound 30 continuously rotates in the arrow A direction.

In the exposure mask 10 in the example shown in the drawing, as a preferable aspect, the optically-anisotropic layer 26 is designed such that Δn×d that is the product of a difference Δn in refractive index of the liquid crystal compound 30 forming the optically-anisotropic layer 26 and a thickness d of the optically-anisotropic layer 26 is about λ/4 wavelength (λ/4) with respect to the wavelength λ of the light emitted to the exposure mask 10.

Specifically, in the optically-anisotropic layer 26, Δn×d is preferably 0.22 to 0.32 [nm] and more preferably 0.2252 to 0.2752 [nm] with respect to the wavelength λ [nm] of the light emitted to the exposure mask 10.

Hereinafter, the action of the exposure of the coating film 14 by the exposure mask 10, that is, the optically-anisotropic layer 26 will be described with reference to the conceptual diagram of FIG. 4.

As described above, the coating film 14 is obtained by applying the coating material including the photo-alignment material to the substrate 16 and drying the coating material. As described above, the coating film 14 is the same as the coating film in the photoalignment layer in the alignment layer 24 of the above-described exposure mask 10. The photo-alignment material is a compound having a photo-aligned group.

As described above, the optically-anisotropic layer 26 forming the exposure mask 10 that is the liquid crystal diffraction element has the liquid crystal alignment pattern where the direction of the optical axis 30A derived from the liquid crystal compound 30 continuously rotates in the arrow A direction.

In addition, in the optically-anisotropic layer 26, as a preferable aspect, Δn× d is about λ/4 wavelength with respect to the wavelength λ of the incidence light. Alternatively, in the optically-anisotropic layer 26, as a preferable aspect, the liquid crystal compound 30 helically turns in the thickness direction.

Further, as described above, the light emitted from the light source 12 to the exposure mask 10 is circularly polarized light having an ellipticity of 0.7 to 1.3.

Figure 4:
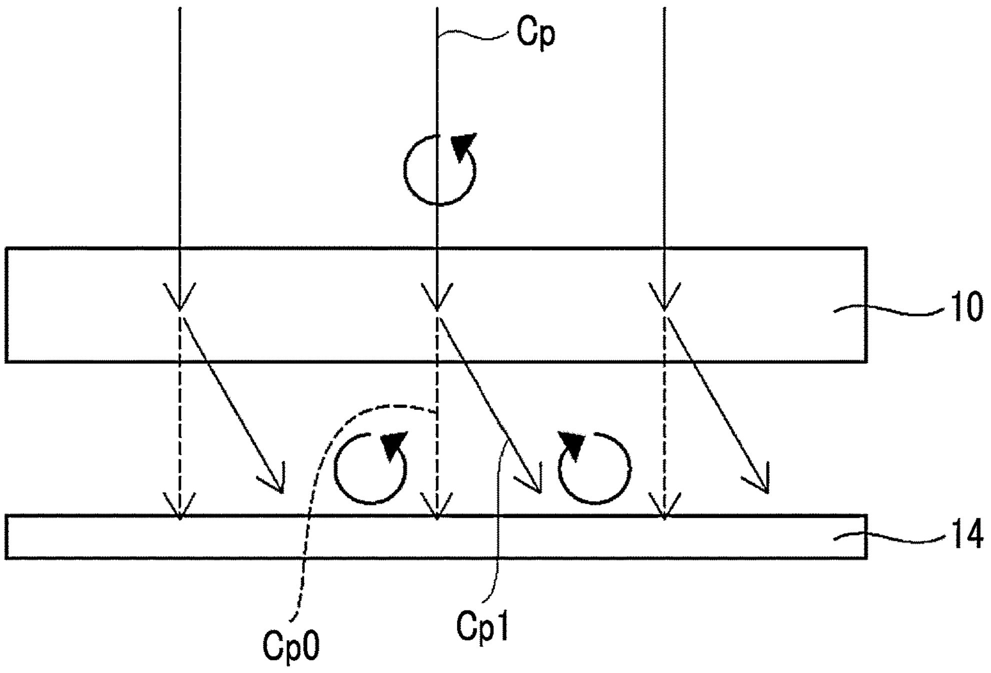
FIG. 4 is a conceptual diagram showing the exposure method of a photoalignment layer according to the present invention.

In a case where the circularly polarized light Cp is incident into the exposure mask 10 in the optically-anisotropic layer 26, as shown in FIG. 4, about half of the circularly polarized light Cp is diffracted by the optically-anisotropic layer 26 to obtain circularly polarized light Cp1 as positive first-order light. In addition, due to the diffraction, the circularly polarized light Cp1 is circularly polarized light having a turning direction opposite to that of the circularly polarized light Cp.

Here, about half of the circularly polarized light Cp incident into the optically-anisotropic layer 26 transmits through the optically-anisotropic layer 26 as it is to obtain circularly polarized light Cp0 as zero-order light.

That is, in the optically-anisotropic layer 26, the diffraction efficiency is about 50%.

Here, the circularly polarized light Cp1 as first-order light and the circularly polarized light Cp0 as zero-order light that is the same as the original circularly polarized light Cp have the same wavelength and opposite turning directions of circularly polarized light. Therefore, the circularly polarized light Cp1 and the circularly polarized light Cp0 adjacent to each other interfere with each other to form the same interference pattern as the liquid crystal alignment pattern of the optically-anisotropic layer 26 on the coating film 14. That is, the alignment pattern where a direction of a line segment corresponding to the optical axis continuously rotates in the arrow A direction is formed on the coating film 14.

As a result, the alignment pattern that is the same as the liquid crystal alignment pattern of the optically-anisotropic layer 26 of the exposure mask 10 and has substantially the same single period Λ described below as that of the liquid crystal alignment pattern is formed on the coating film 14.

As described above, in the exposure method according to the embodiment of the present invention, by effectively utilizing zero-order light that is noise in the related art, the zero-order light and the positive first-order light interfere with each other, the interference pattern is formed on the coating film 14, and the alignment pattern corresponding to the interference pattern is formed.

Therefore, according to the present invention, with the simple method using the exposure mask, the photoalignment layer that has the clear alignment pattern having no disorder caused by light as noise can be formed. Accordingly, by using the photoalignment layer that is exposed using the exposure method according to the embodiment of the present invention, the liquid crystal diffraction element having a high diffraction efficiency can be obtained.

As described above, in the exposure method according to the embodiment of the present invention, the coating film 14 is exposed using the interference pattern obtained by causing the circularly polarized light Cp1 as the positive first-order light and the circularly polarized light Cp0 as the zero-order light to interfere with each other, thereby obtaining the photoalignment layer.

Accordingly, in a case where a difference in intensity between the circularly polarized light Cp1 and the circularly polarized light Cp0 is large, an appropriate interference pattern, that is, an appropriate alignment pattern cannot be formed. In the exposure method according to the embodiment of the present invention, an intensity ratio between the circularly polarized light Cp1 and the circularly polarized light Cp0, that is, an intensity ratio of "circularly polarized light Cp0/circularly polarized light Cp1 (zero-order light/first-order light) is 0.5 to 2.

In a case where the intensity ratio between the circularly polarized light Cp1 and the circularly polarized light Cp0 exceeds 0.5 to 2, a problem such as the disorder of the alignment pattern occurs.

The intensity ratio between the circularly polarized light Cp1 and the circularly polarized light Cp0 is preferably 0.7 to 1.5 and more preferably 0.8 to 1.3.

Both of the circularly polarized light Cp1 as the positive first-order light and the circularly polarized light Cp0 as the zero-order light are circularly polarized light. Both of the circularly polarized light Cp1 as the positive first-order light and the circularly polarized light Cp0 as the zero-order light are preferably circularly polarized light having an ellipticity of 0.6 to 2.

It is preferable that the ellipticity of the circularly polarized light Cp1 and the circularly polarized light Cp0 is 0.6 to 2, for example, from the viewpoint that the clear alignment pattern having no disorder can be formed.

The ellipticity of the circularly polarized light Cp1 and the circularly polarized light Cp0 is more preferably 0.8 to 1.3 and still more preferably 0.9 to 1.2.

Further, as described above, the circularly polarized light Cp1 and the circularly polarized light Cp0 are preferably circularly polarized light components having opposite turning directions as described above.

It is preferable that the circularly polarized light Cp1 and the circularly polarized light Cp0 are circularly polarized light components having opposite turning directions, for example, from the viewpoint that the clear alignment pattern having no disorder can be formed.

In the optically-anisotropic layer 26 of the exposure mask 10 having the liquid crystal alignment pattern where the optical axis 30A continuously rotates in the one in-plane direction, a length (distance) over which the optical axis 30A of the liquid crystal compound 30 rotates by 180° in the one in-plane direction is a single period Λ in the liquid crystal alignment pattern.

That is, in the optically-anisotropic layer 26 shown in FIGS. 2 and 3, the length (distance) over which the optical axis 30A of the liquid crystal compound 30 rotates by 180° in the arrow A direction in which the direction of the optical axis 30A changes while continuously rotating in a plane is set as the single period Λ in the liquid crystal alignment pattern. In other words, the single period Λ in the liquid crystal alignment pattern is defined by the distance between θ and θ+180° that is a range of the angle between the optical axis 30A of the liquid crystal compound 30 and the arrow A direction.

That is, a distance between centers of two liquid crystal compounds 30 in the arrow A direction is the single period A, the two liquid crystal compounds 30 having the same angle in the arrow A direction. Specifically, as shown in FIG. 3, a distance of centers in the arrow A direction of two liquid crystal compounds 30 in which the arrow A direction and the direction of the optical axis 30A match with each other is the single period A.

In the exposure mask 10, in the liquid crystal alignment pattern of the optically-anisotropic layer 26, the single period Λ is repeated in the arrow A direction, that is, in the one in-plane direction in which the direction of the optical axis 30A changes while continuously rotating. In addition, the exposure mask 10 (optically-anisotropic layer 26) is a liquid crystal diffraction element, and the single period Λ is the period (single period) of the diffraction structure.

Likewise, regarding the single period Λ in the coating film 14, that is, the photoalignment layer, a length over which the alignment axis corresponding to the optical axis 30A of the liquid crystal compound 30 rotates by 180° in the one in-plane direction is the single period Λ in the alignment pattern.

The single period Λ of the photoalignment layer may be grasped, for example, by forming the optically-anisotropic layer on the photoalignment layer and measuring the single period Λ of the optically-anisotropic layer.

As described above, in the exposure method according to the embodiment of the present invention, the liquid crystal alignment pattern of the optically-anisotropic layer 26 and the alignment pattern formed in the coating film 14, that is, the photoalignment layer are the same and have substantially the same single period A.

Specifically, a ratio between the length of the single period Λ of the liquid crystal alignment pattern in the optically-anisotropic layer 26 and the length of the single period Λ of the alignment pattern formed in the coating film 14, that is, a ratio of "coating film/optically-anisotropic layer" is preferably 0.7 to 1.5.

It is preferable that the ratio between the lengths of the single periods A in the optically-anisotropic layer 26 and the coating film 14 is 0.7 to 1.5, for example, from the viewpoint that the clear alignment pattern having no disorder can be formed.

The ratio between the length of the single period Λ of the liquid crystal alignment pattern in the optically-anisotropic layer 26 and the length of the single period Λ of the alignment pattern formed in the coating film 14 is more preferably 0.8 to 1.3 and still more preferably 0.9 to 1.2.

As described above, during the formation of the alignment pattern on the coating film using the exposure mask in the related art, as the alignment pattern becomes finer, that is, as the single period Λ in the alignment pattern decreases, the amount of the zero-order light as noise increases, and the disorder of the alignment pattern occurs.

On the other hand, in the exposure method according to the embodiment of the present invention where the zero-order light is effectively utilized, as the alignment pattern becomes finer, the disorder of the alignment pattern is very small.

In consideration of this point, in the exposure method according to the embodiment of the present invention, it is preferable that the alignment pattern formed in the coating film 14 (photoalignment layer) has a region where the length of the single period Λ is 5 μm or less. That is, the exposure method according to the embodiment of the present invention is more suitably used for the formation of the fine alignment pattern on the coating film 14.

It is more preferable that the alignment pattern formed in the coating film 14 (photoalignment layer) has a region where the single period Λ is 3 μm or less, and it is still more preferable that the alignment pattern formed in the coating film 14 (photoalignment layer) has a region where the single period Λ is 2 μm or less.

In the optically-anisotropic layer 26 of the exposure mask 10, as shown in FIG. 3, the direction of the optical axis 30A derived from the liquid crystal compound 30 continuously rotates only in the one in-plane direction.

In the exposure method according to the embodiment of the present invention, the liquid crystal alignment pattern in the exposure mask 10 (optically-anisotropic layer 26) that is the liquid crystal diffraction element, that is, the alignment pattern formed in the coating film 14 is not particularly limited, and various liquid crystal alignment patterns can be used.

Figure 6:
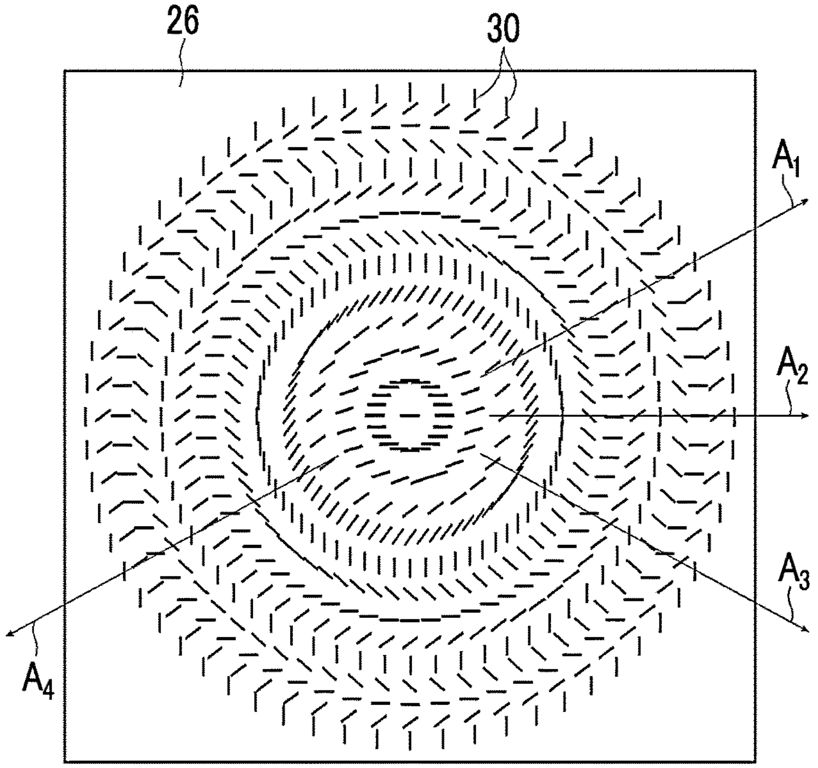
FIG. 6 is a schematic plan view showing another example of the optically-anisotropic layer.

For example, as conceptually shown in a plan view of FIG. 6, an exposure mask that. includes the optically-anisotropic layer 26 having the liquid crystal alignment pattern can be used.

The optically-anisotropic layer 26 has a liquid crystal alignment pattern in a radial shape from an inner side toward an outer side, the liquid crystal alignment pattern being a pattern in which the direction of the optical axis derived from the liquid crystal compound changes while continuously rotating in the one in-plane direction. That is, the liquid crystal alignment pattern in the optically-anisotropic layer 26 shown in FIG. 6 is a concentric circular pattern having a concentric circular shape where the one in-plane direction in which the direction of the optical axis derived from the liquid crystal compound 30 changes while continuously rotating moves from an inner side toward an outer side.

In the optically-anisotropic layer 26, the direction of the optical axis of the liquid crystal compound 30 changes while continuously rotating in a plurality of directions from the center toward the outer side of the optically-anisotropic layer 26, for example, a direction indicated by an arrow $A_1$, a direction indicated by an arrow $A_2$, a direction indicated by an arrow $A_3$, a direction indicated by an arrow $A_4$, or . . . .

Accordingly, in the optically-anisotropic layer 26, the rotation direction of the optical axis of the liquid crystal compound 30 is the same as all the directions (one direction). In the example shown in the drawing, in all the directions including the direction indicated by the arrow $A_1$, the direction indicated by the arrow $A_2$, the direction indicated by the arrow $A_3$, and the direction indicated by the arrow $A_4$, the rotation direction of the optical axis of the liquid crystal compound 30 is counterclockwise.

That is, in a case where the arrow $A_1$ and the arrow $A_4$ are assumed as one straight line, the rotation direction of the optical axis of the liquid crystal compound 30 is reversed at the center of the optically-anisotropic layer 26 on the straight line. For example, the straight line formed by the arrow $A_1$ and the arrow $A_4$ is directed in the right direction (arrow $A_1$ direction) in the drawing. In this case, the optical axis of the liquid crystal compound 30 initially rotates clockwise from the outer direction to the center of the optically-anisotropic layer 26, the rotation direction is reversed at the center of the optically-anisotropic layer 26, and then the optical axis of the liquid crystal compound 30 rotates counterclockwise from the center toward the outer direction of the optically-anisotropic layer 26.

Even in the exposure mask 10 that includes the optically-anisotropic layer 26 having the liquid crystal alignment pattern, as in the above-described case, the circularly polarized light Cp1 as first-order light and the circularly polarized light Cp0 as zero-order light that is the same as the original circularly polarized light Cp are formed by diffraction, and the coating film 14 is exposed by interference light thereof.

As a result, the alignment pattern that is the same as the liquid crystal alignment pattern of the optically-anisotropic layer 26 of the exposure mask 10 where the optical axis changes in a radial shape while continuously rotating and that has substantially the same single period Λ can be formed on the coating film 14.

Figure 7:
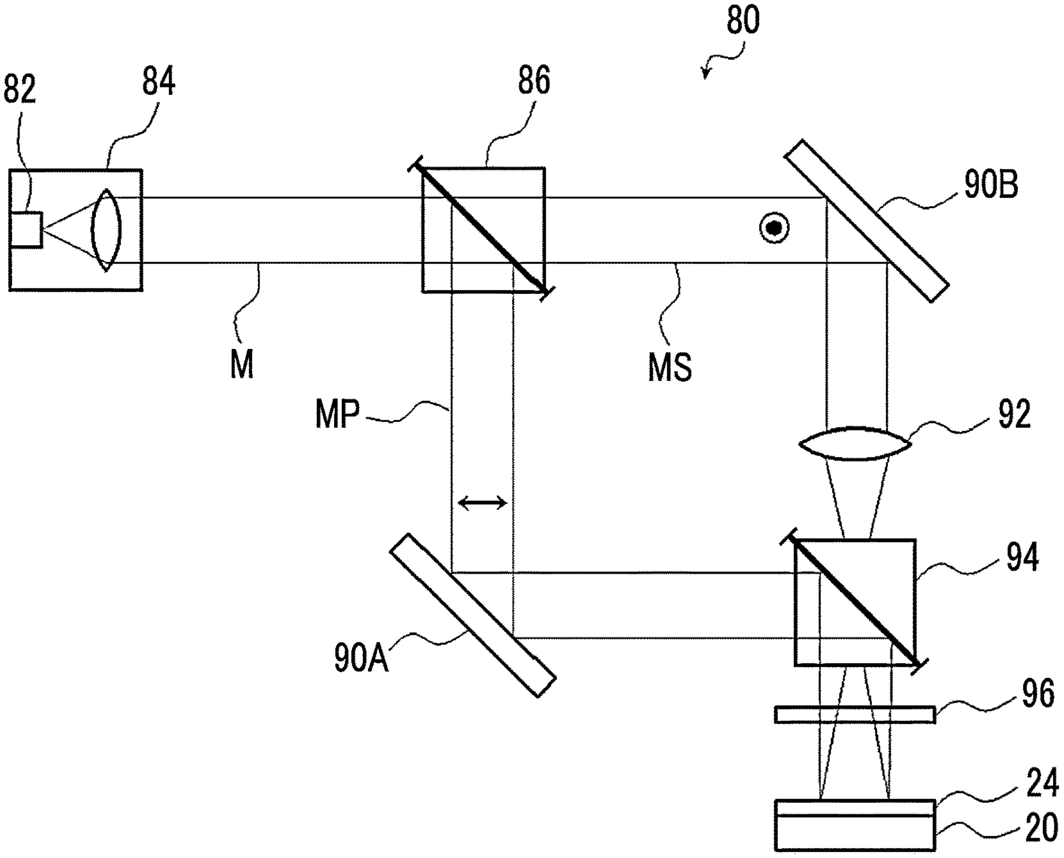
FIG. 7 is a diagram conceptually showing another example of the exposure device of the coating film.

FIG. 7 conceptually shows an example of an exposure device that exposes the coating film as the alignment layer 24 (photoalignment layer) for forming the optically-anisotropic layer 26 to form the alignment pattern shown in FIG. 6 corresponding to the liquid crystal alignment pattern where the optical axis changes in a radial shape while continuously rotating.

An exposure device 80 shown in FIG. 7 includes: a light source 84 that includes a laser 82; a polarization beam splitter 86 that splits the laser light M emitted from the laser 82 into S polarized light MS and P polarized light MP; a mirror 90A that is disposed on an optical path of the P polarized light MP; a mirror 90B that is disposed on an optical path of the S polarized light MS; a lens 92 that is disposed on the optical path of the S polarized light MS; a polarization beam splitter 94; and a λ/4 plate 96.

The P polarized light MP that is split by the polarization beam splitter 86 is reflected from the mirror 90A to be incident into the polarization beam splitter 94. On the other hand, the S polarized light MS that is split by the polarization beam splitter 86 is reflected from the mirror 90B and is collected by the lens 92 to be incident into the polarization beam splitter 94.

The P polarized light MP and the S polarized light MS are combined by the polarization beam splitter 94, are converted into right circularly polarized light and left circularly polarized light by the λ/4 plate 96 depending on the polarization direction, and are incident into the alignment layer 24 on the support 20.

Here, due to interference between the right circularly polarized light and the left circularly polarized light, the polarization state of light with which the alignment layer 24 is irradiated periodically changes according to interference fringes. The intersecting angle between the right circularly polarized light and the left circularly polarized light changes from the inner side to the outer side of the concentric circle. Therefore, an exposure pattern in which the pitch changes from the inner side to the outer side can be obtained. As a result, in the alignment layer 24, a radial (concentric circular) alignment pattern in which the alignment state periodically changes can be obtained.

In the exposure device 80, the single period Λ in the liquid crystal alignment pattern in which the optical axis of the liquid crystal compound 30 continuously rotates by 180° in the one in-plane direction can be controlled by changing the refractive power of the lens 92, the focal length of the lens 92, the distance between the lens 92 and the alignment layer 24, and the like.

In addition, by adjusting the refractive power of the lens 92 (the F number of the lens 92), the length of the single period in the liquid crystal alignment pattern in the one in-plane direction in which the optical axis continuously rotates can be changed.

Specifically, the length of the single period in the liquid crystal alignment pattern in the one in-plane direction in which the optical axis continuously rotates can be changed depending on a light spread angle at which light is spread by the lens 92 due to interference with parallel light. More specifically, in a case where the refractive power of the lens 92 is weak, light is approximated to parallel light. Therefore, the length Λ of the single period in the liquid crystal alignment pattern gradually decreases from the inner side toward the outer side. Conversely, in a case where the refractive power of the lens 92 becomes stronger, the length A of the single period in the liquid crystal alignment pattern rapidly decreases from the inner side toward the outer side.

In the above-described example, in the optically-anisotropic layer 26 forming the liquid crystal diffraction element as the exposure mask 10, as shown in FIG. 2, the liquid crystal compounds 30 face the same direction in the thickness direction.

However, in the exposure method according to the embodiment of the present invention, the optically-anisotropic layer 26 forming the liquid crystal diffraction element as the exposure mask 10 is not particularly limited.

That is, in the exposure method according to the embodiment of the present invention, in the optically-anisotropic layer 26 forming the liquid crystal diffraction element as the exposure mask 10, the liquid crystal compound 30 may helically turn in the thickness direction. That is, the liquid crystal compound 30 forming the optically-anisotropic layer 26 may be helically twisted and aligned in the thickness direction.

In the optically-anisotropic layer that has the above-described liquid crystal alignment pattern and where the liquid crystal compound 30 helically turns in the thickness direction, in an image obtained by observing a cross section taken in a thickness direction along the one in-plane direction where the direction of the optical axis 30A of the liquid crystal compound 30 changes while continuously rotating with a scanning electron microscope (SEM), a stripe pattern of a bright portion and a dark portion that is derived from the turning of the liquid crystal compound 30 and is tilted with respect to a main surface is observed.

In the following description, the image obtained by observing the cross section taken in the thickness direction along the one in-plane direction in which the optical axis 30A rotates with an SEM will also be simply referred to as "cross-sectional SEM image".

The optically-anisotropic layer 26 where the liquid crystal compound 30 helically turns in the thickness direction can be formed by adding a chiral agent to the composition for forming the above-described optically-anisotropic layer 26.

—Chiral Agent (Optically Active Compound)—

The chiral agent has a function of causing a helical structure of a liquid crystal phase to be formed. The chiral agent may be selected depending on the purposes because a helical twisted direction and a helical twisting power (HTP) to be induced vary depending on compounds.

The chiral agent is not particularly limited, and a well-known compound (for example, Liquid Crystal Device Handbook (No. 142 Committee of Japan Society for the Promotion of Science, 1989), Chapter 3, Article 4-3, chiral agent for twisted nematic (TN) or super twisted nematic (STN), p. 199), isosorbide, or an isomannide derivative can be used.

In general, the chiral agent includes a chiral carbon atom. However, an axially chiral compound or a planar chiral compound not having a chiral carbon atom can also be used as the chiral agent. Examples of the axially chiral compound or the planar chiral compound include binaphthyl, helicene, paracyclophane, and derivatives thereof. The chiral agent may include a polymerizable group. In a case where both the chiral agent and the liquid crystal compound have a polymerizable group, a polymer which includes a repeating unit derived from the polymerizable liquid crystal compound and a repeating unit derived from the chiral agent can be formed due to a polymerization reaction of a polymerizable chiral agent and the polymerizable liquid crystal compound. In this aspect, it is preferable that the polymerizable group in the polymerizable chiral agent is the same as the polymerizable group in the polymerizable liquid crystal compound. Accordingly, the polymerizable group of the chiral agent is preferably an unsaturated polymerizable group, an epoxy group, or an aziridinyl group, more preferably an unsaturated polymerizable group, and still more preferably an ethylenically unsaturated polymerizable group.

In addition, the chiral agent may be a liquid crystal compound.

In a case where the chiral agent includes a photoisomerization group, a desired twisted alignment corresponding to a luminescence wavelength can be formed by irradiation of an actinic ray or the like through a photo mask after coating and alignment, which is preferable. As the photoisomerization group, an isomerization portion of a photochromic compound, an azo group, an azoxy group, or a cinnamoyl group is preferable. Specific examples of the compound include compounds described in JP2002-80478A, JP2002-80851A, JP2002-179668A, JP2002-179669A, JP2002-179670A, JP2002-179681A, JP2002-179682A, JP2002-338575A, JP2002-338668A, JP2003-313189A, and JP2003-313292A.

The content of the chiral agent in the liquid crystal composition is preferably 0.01 to 200 mol % and more preferably 1 to 30 mol % with respect to the content molar amount of the liquid crystal compound.

This way, in a case where the optically-anisotropic layer 26 has the liquid crystal alignment pattern where the direction of the optical axis 30A changes while continuously rotating in the one in-plane direction and has the structure where liquid crystal compound 30 helically turns in the thickness direction, in the cross-sectional SEM image, the optically-anisotropic layer has a bright portion and a dark portion extending from one main surface to another main surface, and has a region where the dark portion is tilted with respect to a main surface of the optically-anisotropic layer 26 in the thickness direction.

The bright portion and the dark portion observed in the cross-sectional SEM image of the optically-anisotropic layer 26 are derived from the direction of the optical axis of the liquid crystal compound. Measurement conditions during the observation of the cross-sectional SEM image of the optically-anisotropic layer 26 can be appropriately set.

In the cross-sectional SEM image of the optically-anisotropic layer 26, in a case where the optically-anisotropic layer 26 has a bright portion and a dark portion extending from one main surface to another main surface, and has a region where the dark portion is tilted with respect to a main surface of the optically-anisotropic layer 26 in the thickness direction, a decrease in the diffraction efficiency of refracted light can be suitably suppressed.

Here, it is preferable that the optically-anisotropic layer 26 forming the liquid crystal diffraction element as the exposure mask 10 has a region where an angle (average tilt angle) of the dark portion with respect to a perpendicular direction (normal direction) of the main surface varies in the one in-plane direction, and it is more preferable that the optically-anisotropic layer 26 has a region where the angle gradually changes.

In a case where the above-described optically-anisotropic layer 26 has the configuration in which a region where the single period Λ over which the direction of the optical axis of the liquid crystal compound rotates by 180° in a plane varies in the in-plane direction is provided, a region where the size of a twisted angle in the thickness direction varies is provided, and the twisted angle in the thickness direction increases as the single period Λ of the liquid crystal alignment pattern in the region decreases, in an image obtained by observing a cross section of the optically-anisotropic layer taken in a thickness direction along the one in-plane direction with a scanning electron microscope, as the length of the single period of the liquid crystal alignment pattern decreases, the angle of the dark portion with respect to the perpendicular direction of the main surface increases.

The configuration where the twisted angle in the thickness direction varies in the plane direction can be formed by adding a photoreactive chiral agent to the liquid crystal composition, applying the liquid crystal composition to the alignment layer, and irradiating the regions with light at different irradiation doses such that the helical twisting power (HTP) of the photoreactive chiral agent varies depending on the regions.

Specifically, the configuration of the optically-anisotropic layer where the twisted angle of the thickness direction varies depending on in-plane regions can be formed by using the chiral agent in which back isomerization, dimerization, isomerization, dimerization or the like occurs due to light irradiation such that the HTP changes and irradiating the liquid crystal composition for forming the optically-anisotropic layer with light having a wavelength at which the HTP of the chiral agent changes before or during the curing of the liquid crystal composition while changing the irradiation dose depending on the regions.

For example, by using a chiral agent in which the HTP decreases during light irradiation, the HTP of the chiral agent decreases during light irradiation. Here, by changing the irradiation dose of light depending on the regions, for example, in a region that is irradiated with the light at a high irradiation dose, the decrease in HTP is large, the induction of helix is small, and thus the twisted angle of the twisted structure decreases. On the other hand, in a region that is irradiated with the light at a low irradiation dose, a decrease in HTP is small, and thus the twisted angle of the twisted structure is large.

The method of changing the irradiation dose of light depending on the regions is not particularly limited, and a method of irradiating light through a gradation mask, a method of changing the irradiation time depending on the regions, or a method of changing the irradiation intensity depending on the regions can be used.

The gradation mask refers to a mask in which a transmittance with respect to light for irradiation changes in a plane.

—Photoreactive Chiral Agent—

The photoreactive chiral agent is formed of, for example, a compound represented by the following Formula (I) and has properties capable of controlling an aligned structure of the liquid crystal compound and changing a helical pitch of the liquid crystal compound, that is, a helical twisting power (HTP) of a helical structure during light irradiation. That is, the photoreactive chiral agent is a compound that causes a helical twisting power of a helical structure derived from a liquid crystal compound, preferably, a nematic liquid crystal compound to change during light irradiation (ultraviolet light to visible light to infrared light), and includes a portion including a chiral portion and a portion in which a structural change occurs during light irradiation as necessary portions (molecular structural units). However, the photoreactive chiral agent represented by the following Formula (I) can significantly change the HTP of liquid crystal molecules.

The above-described HTP represents the helical twisting power of a helical structure of liquid crystal, that is, HTP=1/(Pitch×Chiral Agent Concentration [Mass Fraction]). For example, the HTP can be obtained by measuring a helical pitch (single period of the helical structure; μm) of a liquid crystal molecule at a given temperature and converting the measured value into a value [$\mu m^{-1}$] in terms of the concentration of the chiral agent. In a case where a selective reflection color is formed by the photoreactive chiral agent depending on the illuminance of light, a rate of change in HTP (HTP before irradiation/HTP after irradiation) is preferably 1.5 or higher and more preferably 2.5 or higher in a case where the HTP decreases after irradiation, and is preferably 0.7 or lower and more preferably 0.4 or lower in a case where the HTP increases after irradiation.

Next, the compound represented by Formula (I) will be described.

Formula (I)

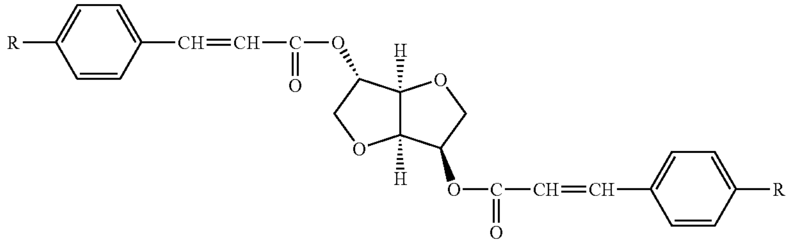

In the formula, R represents a hydrogen atom, an alkoxy group having 1 to 15 carbon atoms, an acryloyloxyalkyloxy group having 3 to 15 carbon atoms in total, or a methacryloyloxyalkyloxy group having 4 to 15 carbon atoms in total.

Examples of the alkoxy group having 1 to 15 carbon atoms include a methoxy group, an ethoxy group, a propoxy group, a butoxy group, a hexyloxy group, and a dodecyloxy group. In particular, an alkoxy group having 1 to 12 carbon atoms is preferable, and an alkoxy group having 1 to 8 carbon atoms is more preferable.

Examples of the acryloyloxyalkyloxy group having 3 to 15 carbon atoms in total include an acryloyloxyethyloxy group, an acryloyloxybutyloxy group, and an acryloyloxydecyloxy group. In particular, an acryloyloxyalkyloxy group having 5 to 13 carbon atoms is preferable, and an acryloyloxyalkyloxy group having 5 to 11 carbon atoms is more preferable.

Examples of the methacryloyloxyalkyloxy group having 4 to 15 carbon atoms in total include a methacryloyloxyethyloxy group, a methacryloyloxybutyloxy group, and a methacryloyloxydecyloxy group. In particular, a methacryloyloxyalkyloxy group having 6 to 14 carbon atoms is preferable, and a methacryloyloxyalkyloxy group having 6 to 12 carbon atoms is more preferable.

The molecular weight of the photoreactive chiral agent represented by Formula (I) is preferably 300 or higher. In addition, it is preferable that the solubility in the liquid crystal compound described below is high, and it is more preferable that the solubility parameter SP value is close to that of the liquid crystal compound.

Hereinafter, specific examples (exemplary compounds (1) to (15)) of the compound represented by Formula (I) will be shown, but the present invention is not limited thereto.

(1)

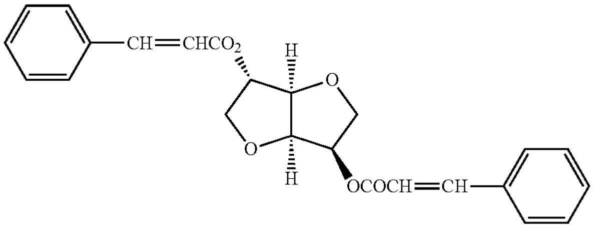

Right Twisted
Mw = 406.43

(2)

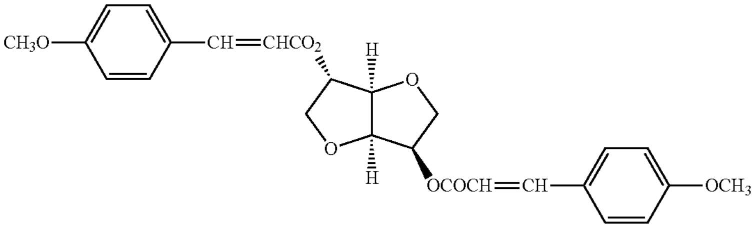

Right Twisted
Mw = 466.48

(3)

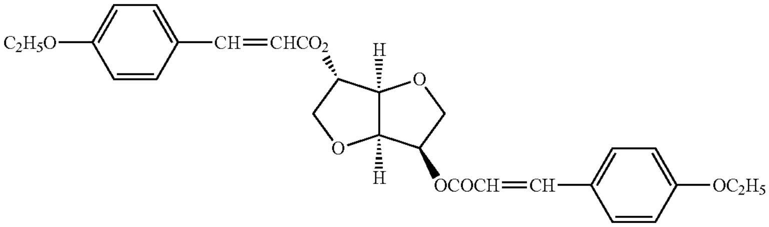

Right Twisted
Mw = 494.53

(4)

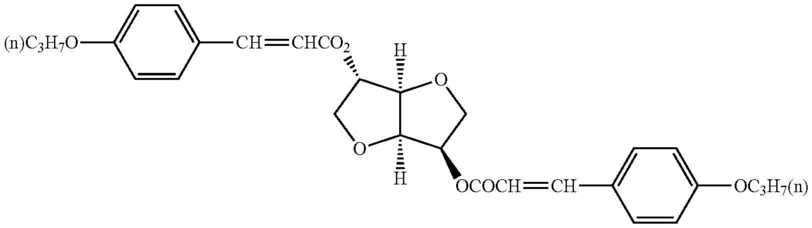

Right Twisted
Mw = 522.59

(5)

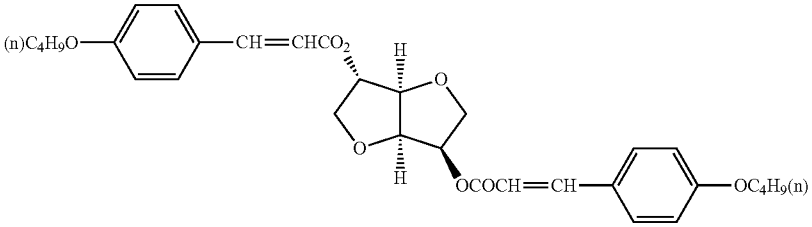

Right Twisted
Mw = 550.64

-continued
(6)
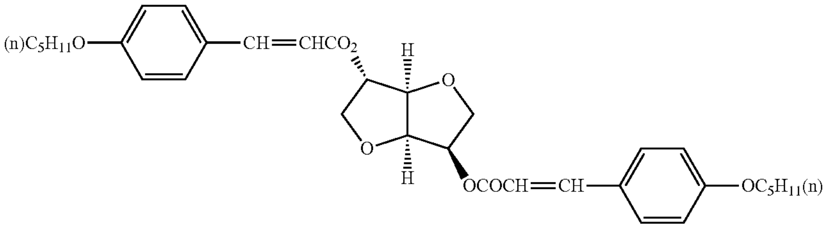
Right Twisted
Mw = 578.69
(7)
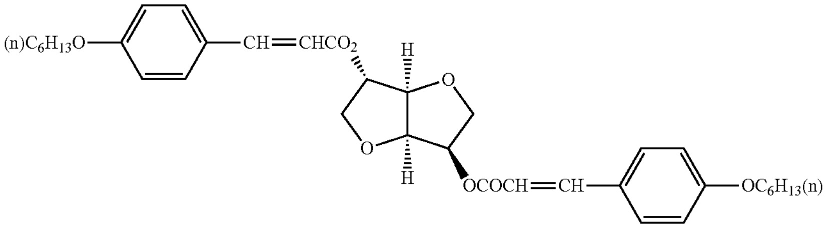
Right Twisted
Mw = 606.75
(8)
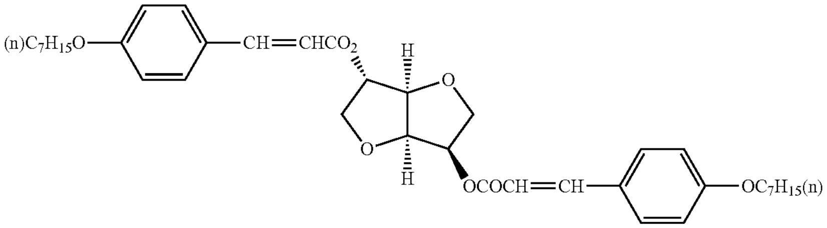
Right Twisted
Mw = 634.80
(9)
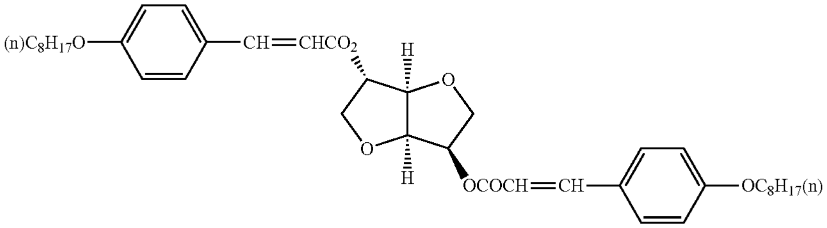
Right Twisted
Mw = 662.85
(10)
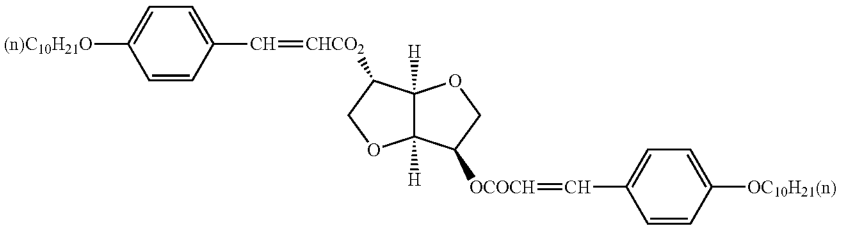
Right Twisted
Mw = 718.96

-continued
(11)
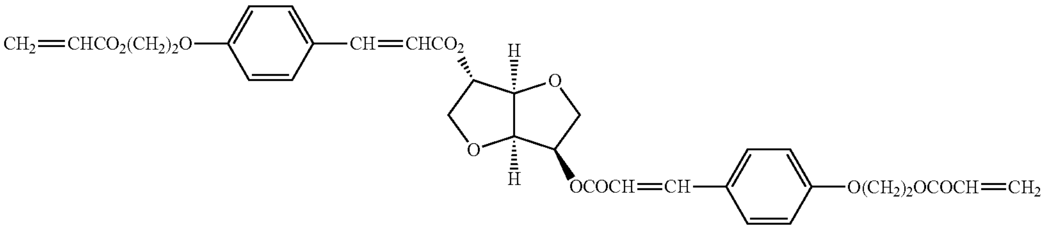
(12)
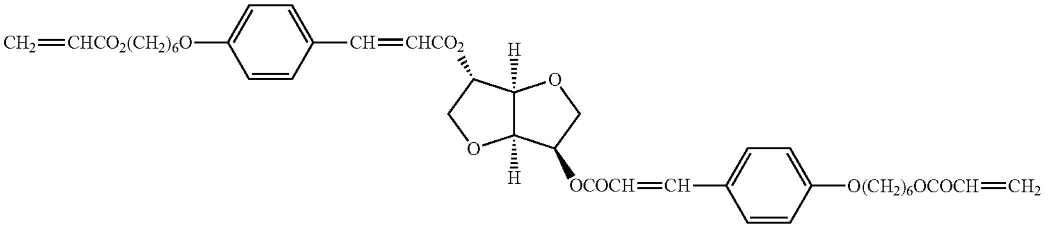
(13)
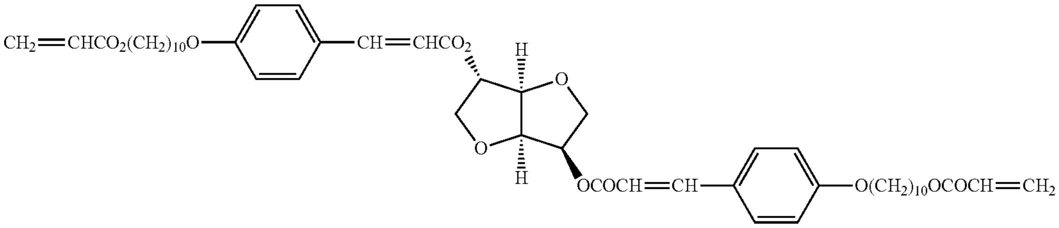
(14)
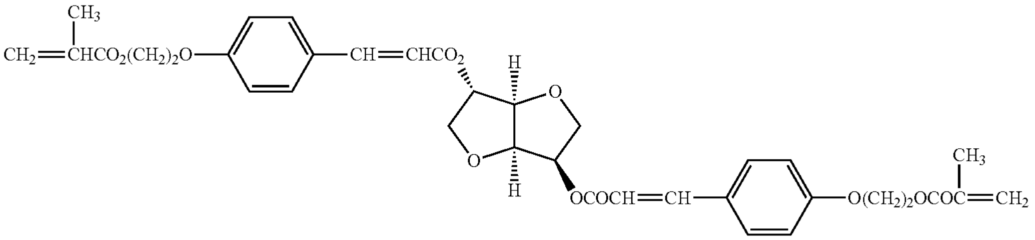
(15)
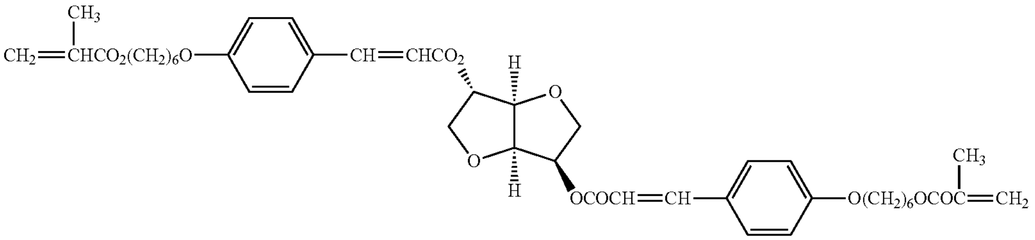

In the present invention, as the photoreactive chiral agent, for example, a photoreactive optically active compound represented by the following Formula (II) is also used.

Formula (II)

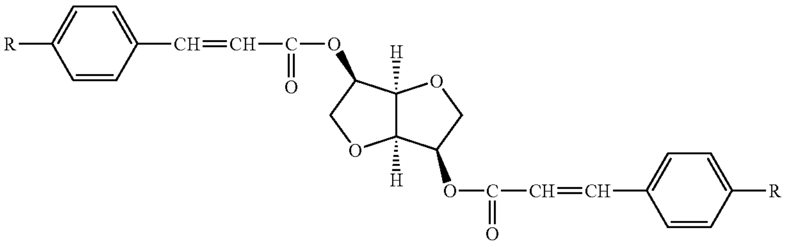

In the formula, R represents a hydrogen atom, an alkoxy group having 1 to 15 carbon atoms, an acryloyloxyalkyloxy group having 3 to 15 carbon atoms in total, or a methacryloyloxyalkyloxy group having 4 to 15 carbon atoms in total.

Examples of the alkoxy group having 1 to 15 carbon atoms include a methoxy group, an ethoxy group, a propoxy group, a butoxy group, a hexyloxy group, an octyloxy group, and a dodecyloxy group. In particular, an alkoxy group having 1 to 10 carbon atoms is preferable, and an alkoxy group having 1 to 8 carbon atoms is more preferable.

Examples of the acryloyloxyalkyloxy group having 3 to 15 carbon atoms in total include an acryloyloxy group, an acryloyloxyethyloxy group, an acryloyloxypropyloxy group, an acryloyloxyhexyloxy group, an acryloyloxybutyloxy group, and an acryloyloxydecyloxy group. In particular, an acryloyloxyalkyloxy group having 3 to 13 carbon atoms is preferable, and an acryloyloxyalkyloxy group having 3 to 11 carbon atoms is more preferable.

Examples of the methacryloyloxyalkyloxy group having 4 to 15 carbon atoms in total include a methacryloyloxy group, a methacryloyloxyethyloxy group, and a methacryloyloxyhexyloxy group. In particular, a methacryloyloxyalkyloxy group having 4 to 14 carbon atoms is preferable, and a methacryloyloxyalkyloxy group having 4 to 12 carbon atoms is more preferable.

The molecular weight of the photoreactive optically active compound represented by Formula (II) is preferably 300 or higher. In addition, it is preferable that the solubility in the liquid crystal compound described below is high, and it is more preferable that the solubility parameter SP value is close to that of the liquid crystal compound.

Hereinafter, specific examples (exemplary compounds (21) to (32)) of the photoreactive optically active compound represented by Formula (II) will be shown, but the present invention is not limited thereto.

(21)

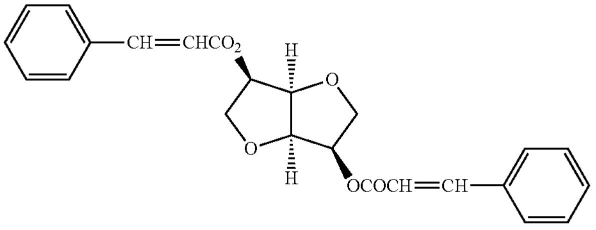

Left Twisted
Mw = 406.43

(22)

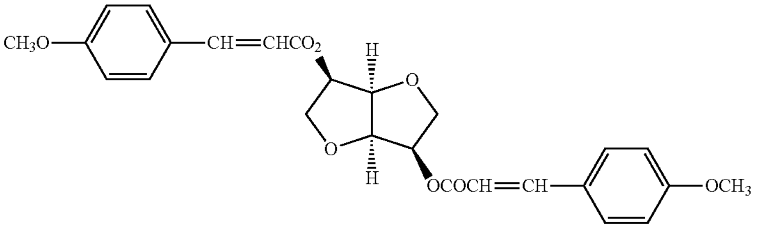

Left Twisted
Mw = 466.48

-continued
(23)
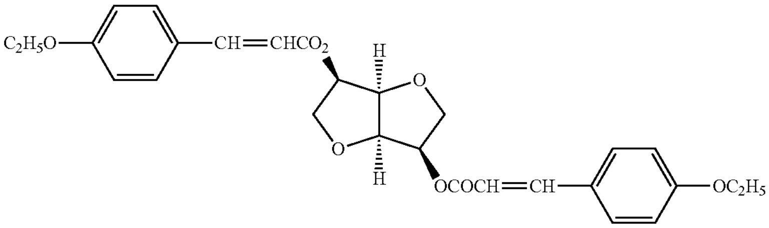
Left Twisted
Mw = 494.53
(24)
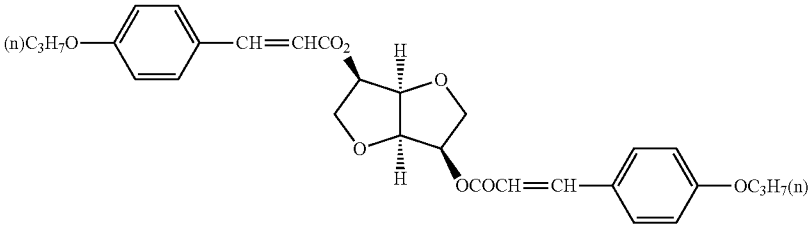
Left Twisted
Mw = 522.59
(25)
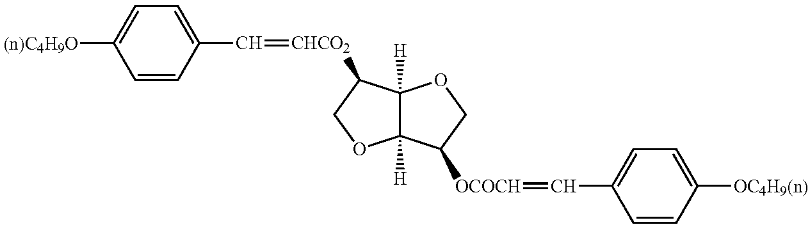
Left Twisted
Mw = 550.64
(26)
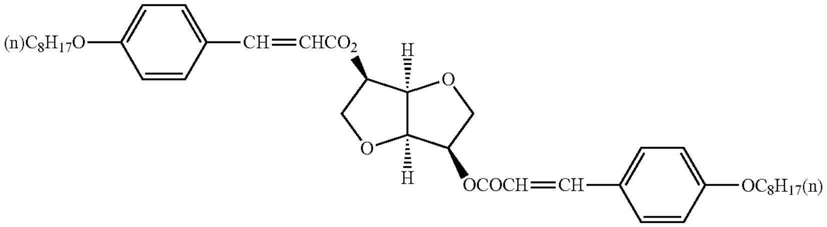
Left Twisted
Mw = 662.85
(27)
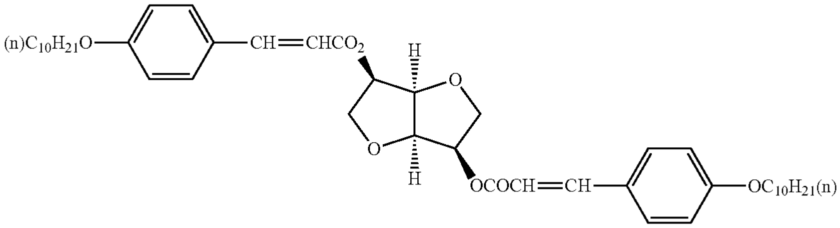
Left Twisted
Mw = 718.96

-continued (28)

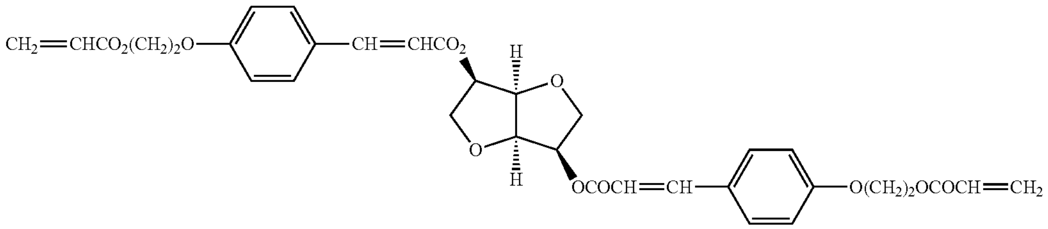

(29)

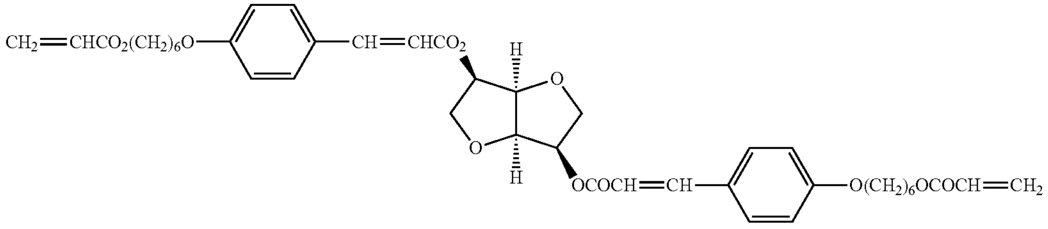

(30)

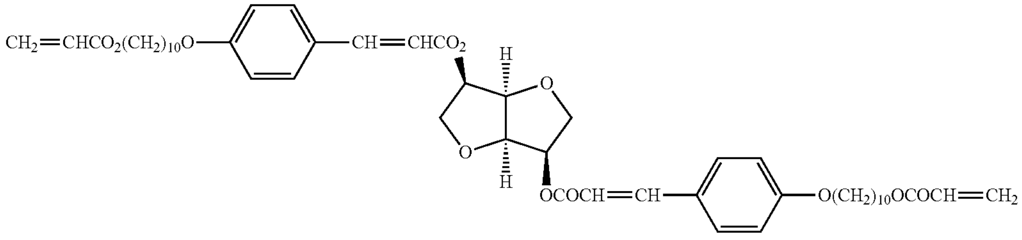

(31)

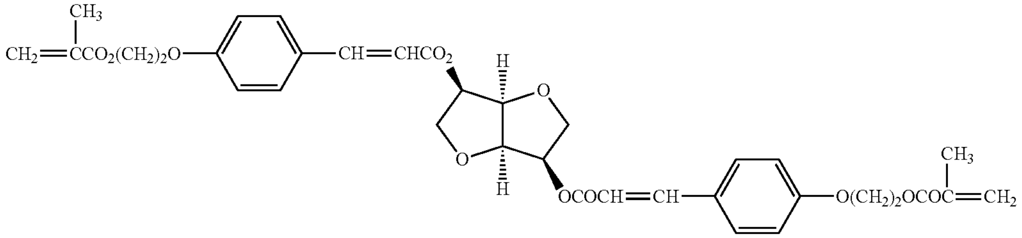

(32)

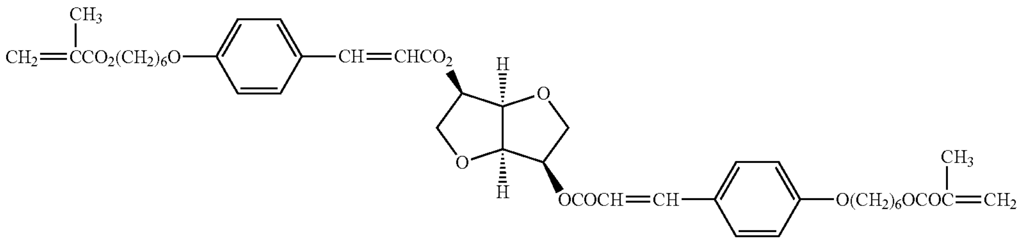

In addition, the photoreactive chiral agent can also be used in combination with a chiral agent having no photoreactivity such as a chiral compound having a large temperature dependence of the helical twisting power. Examples of the well-known chiral agent having no photoreactivity include chiral agents described in JP2000-044451A, JP1998-509726A (JP-H10-509726A), WO1998/000428A, JP2000-506873A, JP1997-506088A (JP-H09-506088A), Liquid Crystals (1996, 21, 327), and Liquid Crystals (1998, 24, 219).

In the cross-sectional SEM image of the optically-anisotropic layer that forms the liquid crystal diffraction element as the exposure mask 10 and where a dark portion 44 is tilted with respect to the perpendicular direction of the main surface, it is preferable that a bright portion and a dark portion extending from one main surface to another main surface are observed, and the dark portion has one or more or two or more inflection points of angle.

Figure 8:
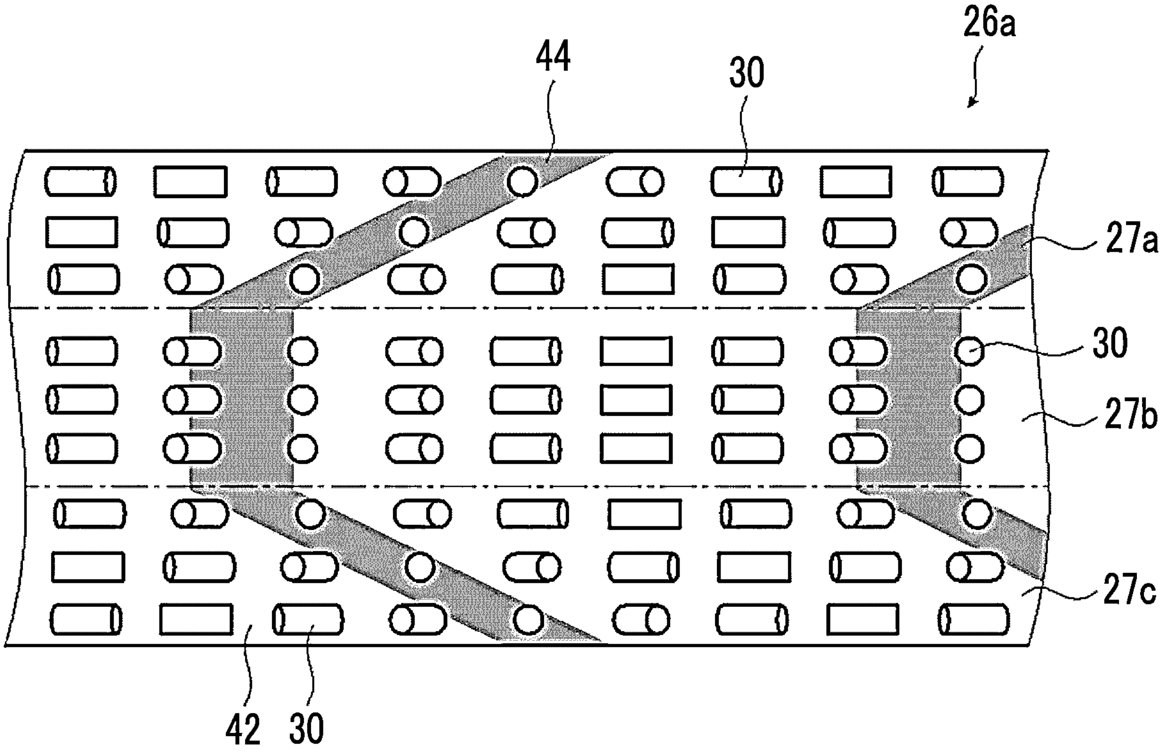
FIG. 8 is a diagram conceptually showing another example of the optically-anisotropic layer.

FIG. 8 shows an example of the optically-anisotropic layer. In FIG. 8, bright portions 42 and dark portions 44 are shown to overlap a cross section of an optically-anisotropic layer 26*a*.

In the cross-sectional SEM image of the optically-anisotropic layer 26*a* shown in FIG. 8, the dark portion 44 has two inflection points where the angle changes. That is, the optically-anisotropic layer 26*a* can also include three regions including a region 27a, a region 27b, and a region 27c corresponding to the inflection points of the dark portion 44 in the thickness direction.

The optically-anisotropic layer 26a also has, at any position in the thickness direction, the liquid crystal alignment pattern where the optical axis derived from the liquid crystal compound 30 rotates clockwise to the left direction in the drawing in the in-plane direction. In addition, the single period of the liquid crystal alignment pattern is fixed in the thickness direction.

In addition, as shown in FIG. 8, in the lower region 27c in the thickness direction, the liquid crystal compound 30 is twisted and aligned to be helically twisted clockwise (to the right) from the upper side to the lower side in the drawing in the thickness direction.

In the middle region 27b in the thickness direction, the liquid crystal compound 30 is not twisted in the thickness direction, and the optical axes of the liquid crystal compounds 30 laminated in the thickness direction face the same direction. That is, it is preferable that the optical axes of the liquid crystal compounds 30 present at the same position in the in-plane direction face the same direction.

In the upper region 27a in the thickness direction, the liquid crystal compound 30 is twisted and aligned to be helically twisted counterclockwise (to the left) from the upper side to the lower side in the drawing in the thickness direction.

That is, in the region 27a, the region 27b, and the region 27c of the optically-anisotropic layer 26a shown in FIG. 8, the twisted states of the liquid crystal compounds 30 in the thickness direction are different from each other.

In the optically-anisotropic layer having the liquid crystal alignment pattern in which the optical axis 30A derived from the liquid crystal compound 30 continuously rotates in the one in-plane direction, the bright portions and the dark portions in the cross-sectional SEM image of the optically-anisotropic layer are observed to connect the liquid crystal compounds facing the same direction.

For example, in FIG. 8, the dark portions 44 are observed to connect the liquid crystal compounds 30 of which the optical axes face a direction orthogonal to the paper plane.

In the lowermost region 27c in the thickness direction, the dark portion 44 is tilted to the upper left side in the drawing. In the middle region 27b, the dark portion 44 extends in the thickness direction. In the uppermost region 27a in the thickness direction, the dark portion 44 is tilted to the upper right side in the drawing.

That is, the optically-anisotropic layer 26a shown in FIG. 8 has two inflection points of angle where the angle of the dark portion 44 changes. In addition, in the uppermost region 27a, the dark portion 44 is tilted to the upper right side. In the lowermost region 27c, the dark portion 44 is tilted to the upper left side. That is, in the region 27a and the region 27c, the tilt directions of the dark portions 44 are different from each other.

Further, the optically-anisotropic layer 26a shown in FIG. 8 has one inflection point where the dark portion 44 is folded in a direction opposite to the tilt direction.

Specifically, regarding the dark portion 44 of the optically-anisotropic layer 26a, the tilt direction in the region 27a and the tilt direction in the region 27b are opposite to each other. Therefore, at the inflection point positioned at the interface between the region 27a and the region 27b, the tilt direction is folded in the opposite direction. That is, the optically-anisotropic layer 26 has one inflection point where the tilt direction is folded in the opposite direction.

In addition, in the region 27a and the region 27c of the optically-anisotropic layer 26a, for example, the thicknesses are the same, and the twisted states of the liquid crystal compounds 30 in the thickness direction are different from each other. Therefore, as shown in FIG. 1, the bright portions 42 and the dark portions 44 in the cross-sectional SEM image are formed in a substantially C-shape.

Accordingly, in the optically-anisotropic layer 26a, the shape of the dark portion 44 is symmetrical with respect to the center line in the thickness direction.

In addition, in the liquid crystal diffraction element according to the embodiment of the present invention, in the optically-anisotropic layer 26a, that is, the cross-sectional SEM image, the optically-anisotropic layer 26a has the bright portions 42 and the dark portions 44 extending from one surface to another surface, each of the dark portions 44 has one or more or two or more inflection points of angle. As a result, the wavelength dependence of the diffraction efficiency can be reduced, and light can be diffracted with the same diffraction efficiency irrespective of wavelengths.

In the example shown in FIG. 8, the dark portion 44 is configured to have two inflection points of angle. However, the present invention is not limited to this configuration, and the dark portion 44 may have one inflection point of angle or may have three or more inflection points of angle.

Figure 9:
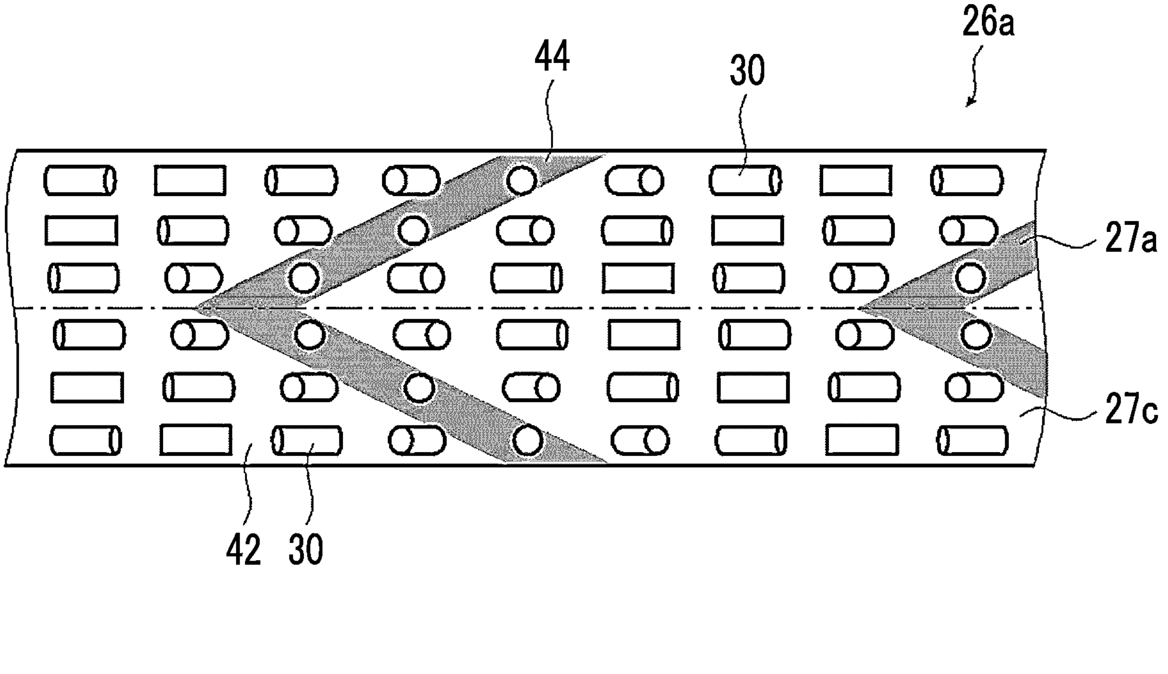
FIG. 9 is a diagram conceptually showing another example of the optically-anisotropic layer.

For example, in the configuration where the dark portion 44 of the optically-anisotropic layer has one inflection point of angle, for example, the dark portion 44 may consist of the region 27a and the region 27c of FIG. 8 as shown in FIG. 9, the dark portion 44 may consist of the region 27a and the region 27b, or the dark portion 44 may consist of the region 27b and the region 27c. Alternatively, in the configuration where the dark portion 44 of the optically-anisotropic layer has three inflection points of angle, the region 27a and the region 27c shown in FIG. 8 may be alternately provided two by two.

As described above, in a case where the optically-anisotropic layer has the radial liquid crystal alignment pattern as shown in FIG. 6, the single period Λ in the optically-anisotropic layer gradually decreases from the center toward an outer side.

This way, in a case where the optically-anisotropic layer 26 has the region where the single period Λ of the liquid crystal alignment pattern gradually decreases in the one in-plane direction, it is preferable that the helical turning angle of the liquid crystal compound 30 toward the thickness direction gradually increases according to the gradual decrease of the single period A.

This way, in a case where the optically-anisotropic layer 26 has the region where the single period Λ of the liquid crystal alignment pattern gradually decreases in the one in-plane direction, it is preferable that the angle of the dark portion 44 with respect to the perpendicular direction of the main surface increases according to the gradual decrease of the single period Λ.

Figure 10:
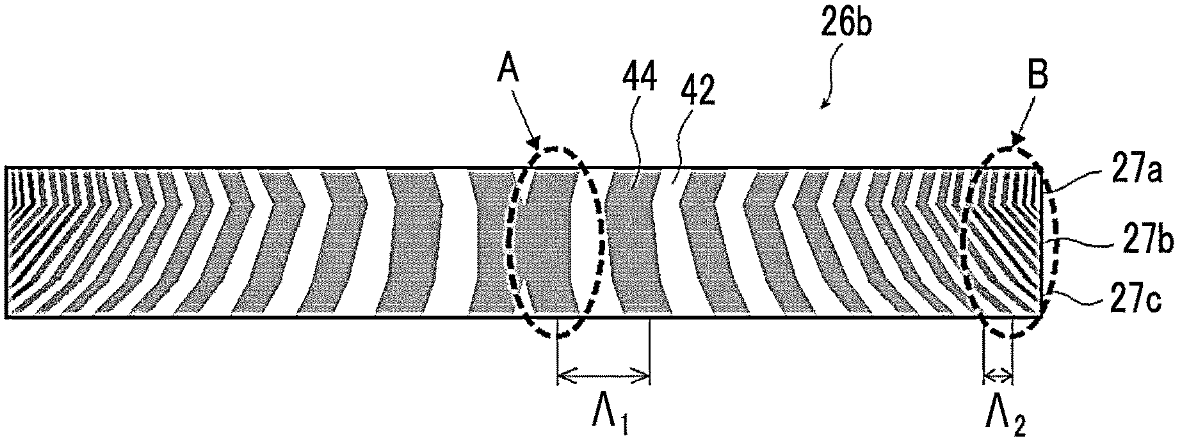
FIG. 10 is a diagram conceptually showing another example of the optically-anisotropic layer.

FIG. 10 shows an example of the optically-anisotropic layer.

An optically-anisotropic layer 26b shown in FIG. 10 has a configuration where the one in-plane direction in which the direction of the optical axis of the liquid crystal compound 30 changes while continuously rotating is provided in the liquid crystal alignment pattern in a radial shape from the center of the optically-anisotropic layer 26 and where the single period Λ of the liquid crystal alignment pattern gradually decreases from the center toward the outer side in each of the directions.

In addition, in the cross-sectional SEM image, the optically-anisotropic layer 26*b* has a stripe pattern of the bright portions 42 and the dark portions 44 extending one surface to another surface, and each of the dark portions 44 has two inflection points. In addition, in all of the dark portions 44, a tilt direction in the upper region in the drawing and a tilt direction in the lower region in the drawing are opposite to each other. That is, each of the dark portions 44 has regions where the tilt directions are different.

Specifically, in a portion of the optically-anisotropic layer 26*b* shown in FIG. 10 on the right side from the center in the plane direction, the dark portion 44 is tilted in the right direction in an upper region in the drawing, and the dark portion 44 is tilted in the left direction in a lower region in the drawing. On the other hand, in a portion of the optically-anisotropic layer 26*b* on the left side from the center, the dark portion 44 is tilted in the left direction in an upper region in the drawing, and the dark portion 44 is tilted in the right direction in a lower region in the drawing.

In addition, in the optically-anisotropic layer 26*b*, in a case where an angle between a line that connects a contact between each of the dark portions 44 and one surface and a contact between the dark portion 44 and another surface and the perpendicular direction of the main surface of the optically-anisotropic layer 26*b* is set as an angle, the angle of the dark portion 44 gradually changes in the one in-plane direction (arrows $A_1$, $A_2$, $A_3$, and the like) in which the direction of the optical axis of the liquid crystal compound 30 changes while continuously rotating. Specifically, in the example shown in FIG. 10, the angle of the dark portion 44 in the vicinity of the center is about 0°, and the angle gradually increases from the center toward an outer side. That is, in the optically-anisotropic layer 26*b* in the example shown in the drawing, as the single period Λ of the liquid crystal alignment pattern gradually decreases, the angle of the dark portion 44 gradually increases.

In the present invention, the angle of the dark portion gradually changing represents both of a case where the angle continuously changes and a case where the angle changes stepwise.

It can also be said that the optically-anisotropic layer 26*b* has three regions (27*a*, 27*b*, 27*c*) in the thickness direction, and the tilt angles of the dark portions 44 at the same position in the plane direction in the regions are different.

Here, a cross-sectional SEM image in a radial center portion of the optically-anisotropic layer 26*b* shown in FIG. 10 (region indicated by A in FIG. 10) is the diagram shown in FIG. 8.

As shown in FIG. 8, in the center portion, in the lower region 27*c* in the thickness direction, the liquid crystal compound 30 is aligned to be twisted clockwise (to the right) from the upper side to the lower side in the drawing in the thickness direction.

On the other hand, in the middle region 27*b* in the thickness direction, the liquid crystal compound 30 is not twisted in the thickness direction, and the optical axes of the liquid crystal compounds 30 laminated in the thickness direction face the same direction. That is, it is preferable that the optical axes of the liquid crystal compounds 30 present at the same position in the plane direction face the same direction.

In addition, in the upper region 27*a* in the thickness direction, the liquid crystal compound 30 is aligned to be twisted counterclockwise (to the left) from the upper side to the lower side in the drawing in the thickness direction.

In the radial center portion of the optically-anisotropic layer 26*b*, the twisted states of the liquid crystal compounds 30 in the thickness direction in the region 27*a*, the region 27*b*, and the region 27*c* are different from each other. Therefore, as shown in FIG. 8, the bright portions 42 and the dark portions 44 in the SEM image are formed in a substantially C-shape.

In addition, in the example shown in FIG. 8, the thickness of the region 27*a* and the thickness of the region 27*c* are substantially the same, and the twisted angle of the thickness direction of the liquid crystal compound 30 in the region 27*a* and the twisted angle of the thickness direction of the liquid crystal compound 30 in the region 27*c* are substantially the same. Accordingly, in the dark portion 44 of the region 27*a* and the dark portion 44 of the region 27*c*, the tilt directions are opposite, and the tilt angles are the same. In the region 27*b*, the liquid crystal compounds 30 are not twisted in the thickness direction. Therefore, the dark portion 44 is not tilted. Accordingly, the angle of the dark portion 44 in the center portion of the optically-anisotropic layer 26 is substantially 0°.

That is, in a cross section of the radial center portion of the optically-anisotropic layer 26*b*, shapes of the bright portions 42 and the dark portions 44 can be made to be symmetrical with respect to the center line of the optically-anisotropic layer 26*b* in the thickness direction.

Figure 11:
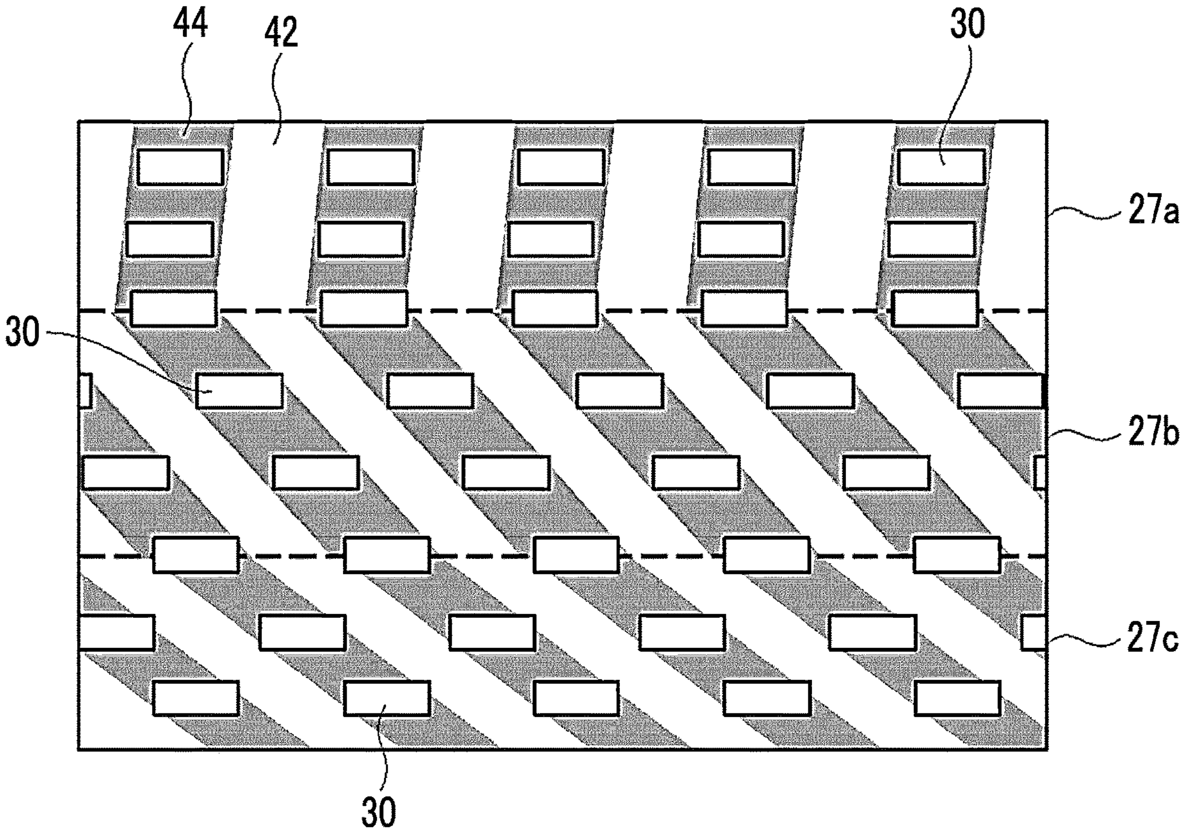
FIG. 11 is a diagram conceptually showing another example of the optically-anisotropic layer.
Figure 12:
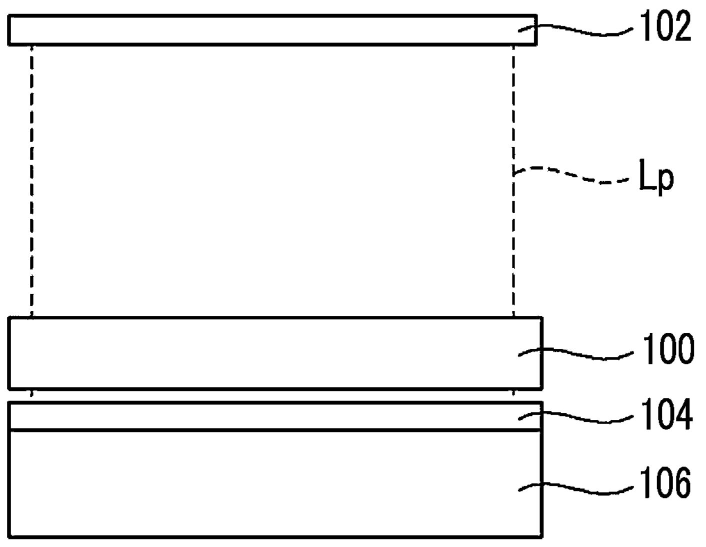
FIG. 12 is a conceptual diagram showing an exposure method of a photoalignment layer in the related art.
Figure 13:
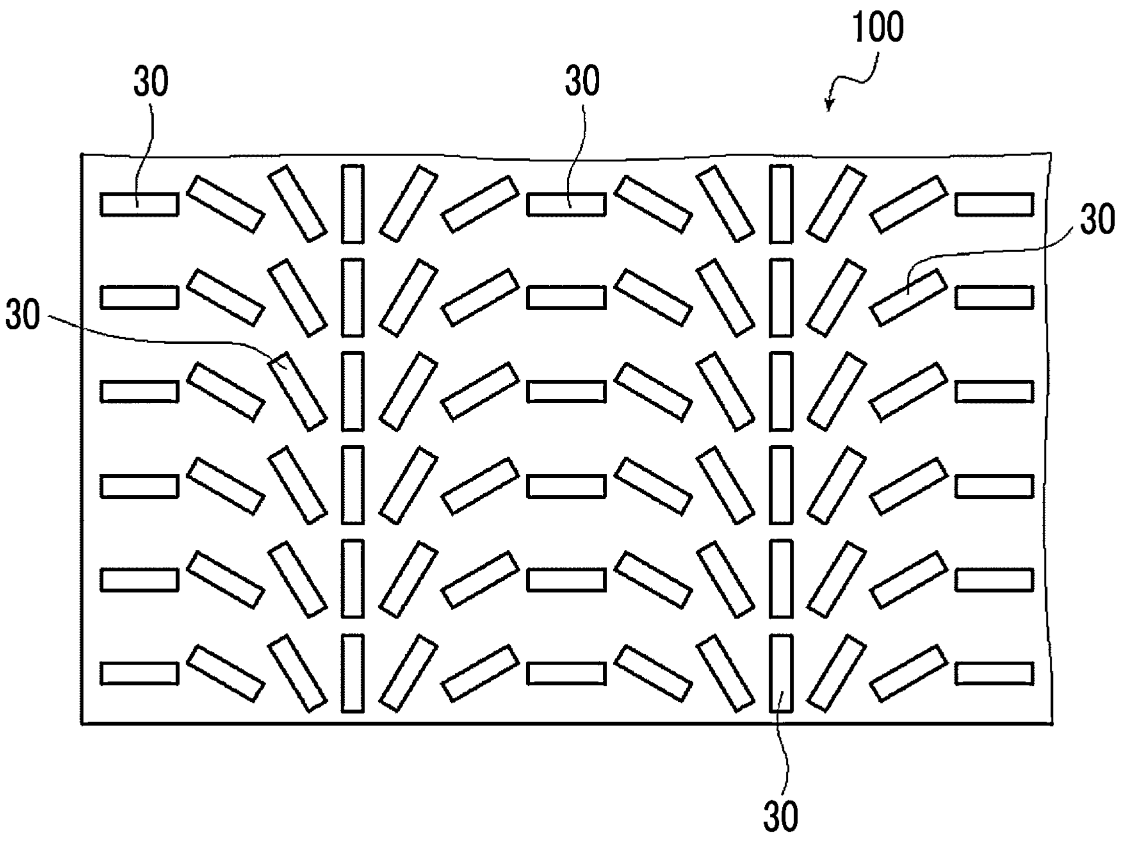
FIG. 13 is a conceptual diagram showing an exposure method of a photoalignment layer in the related art.
Figure 14:
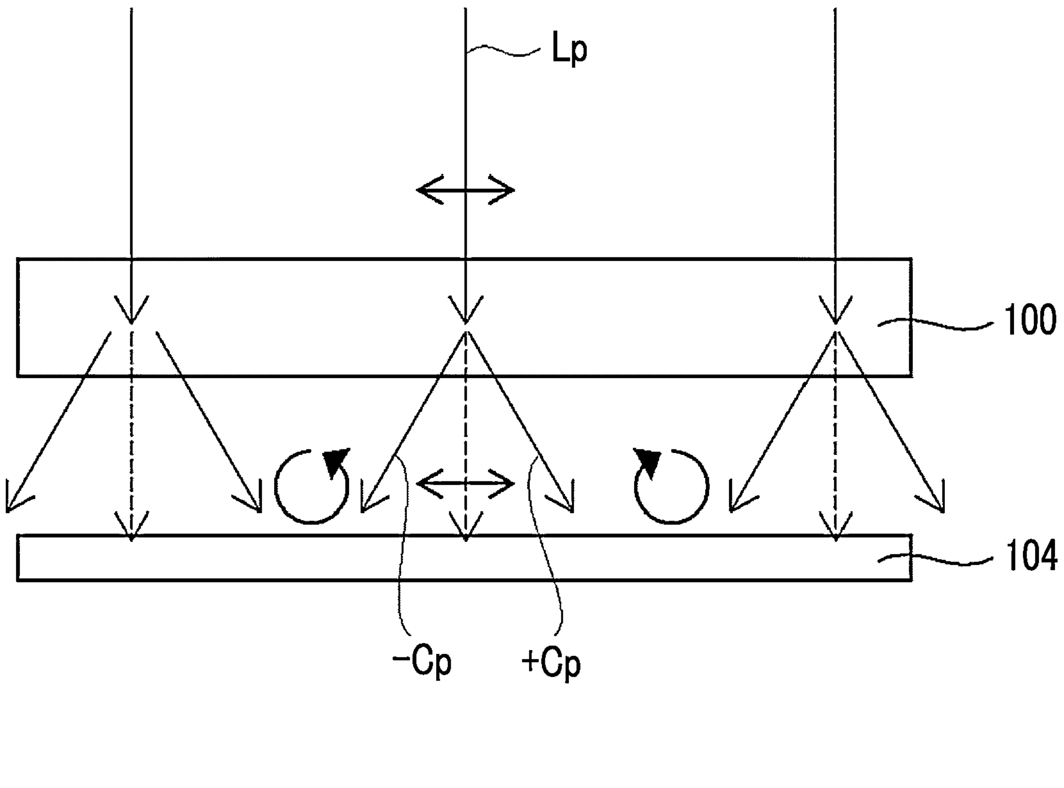
FIG. 14 is a conceptual diagram showing the exposure method of a photoalignment layer in the related art.

On the other hand, a cross-sectional SEM image in a radial end portion of the optically-anisotropic layer 26*b* shown in FIG. 10 (an outer side portion; a region indicated by B in FIG. 10) is the diagram shown in FIG. 11.

In the outer side portion shown in FIG. 11, in the lower region 27*c* in the thickness direction, the liquid crystal compound 30 is aligned to be twisted clockwise (to the right) from the upper side to the lower side in the drawing in the thickness direction. In the outer side portion of the region 27*c*, the twisted angle of the thickness direction is larger than that of the center portion.

In addition, in the middle region 27*b* in the thickness direction, the liquid crystal compound 30 is aligned to be twisted clockwise (to the right) from the upper side to the lower side in the drawing in the thickness direction.

In addition, the twisted angle of the thickness direction in the region 27*c* and the twisted angle of the thickness direction in the region 27*b* are different. Accordingly, in the dark portion 44 of the region 27*c* and the dark portion 44 of the region 27*b*, the tilt directions are the same, and the tilt angles are different.

On the other hand, in an upper region 27*a* in the thickness direction, the liquid crystal compound 30 is aligned to be twisted counterclockwise (to the left) from the upper side to the lower side in the drawing in the thickness direction. Accordingly, the dark portion 44 of the region 27*a* is tilted in a direction opposite to that of the region 27*c* and the region 27*b*. In addition, in the outer side portion of the region 27*a*, the twisted angle of the thickness direction is smaller than that of the center portion. Therefore, the absolute value of the tilt angle of the dark portion 44 in the region 27*a* is smaller than the absolute value of the tilt angle of the dark portion 44 in the region 27*c*.

Accordingly, the angle of the dark portion 44 in the outer side portion of the optically-anisotropic layer 26*b* is a value that is not 0°.

That is, in a cross section of the radial end portion of the optically-anisotropic layer 26*b*, shapes of the bright portions 42 and the dark portions 44 can be made to be asymmetrical with respect to the center line of the optically-anisotropic layer 26*b* in the thickness direction.

In the example shown in FIG. 10, in the region 27*a*, the region 27*b*, and the region 27*c* of the optically-anisotropic layer 26*b*, the single period Λ of the liquid crystal alignment pattern gradually decreases from the center toward the outer side. In addition, the right twist of the thickness direction in the region 27*c* increases from the center toward the outer side, the right twist of the thickness direction in the region 27*b* increases from the center toward the outer side, and the left twist of the thickness direction in the region 27*a* decreases from the center toward the outer side.

As a result, it can be said that, in each of the regions, the twist of the thickness direction at the center can be imparted with the right twist toward the outer side. With this configuration, in the optically-anisotropic layer 26*b*, as shown in FIG. 10, shapes of the bright portions 42 and the dark portions 44 in the cross section of the radial center portion are symmetrical with respect to the center line of the optically-anisotropic layer 26*b* in the thickness direction, and shapes of the bright portions 42 and the dark portions 44 in the cross section of the radial end portion are asymmetrical with respect to the center line of the optically-anisotropic layer 26*b* in the thickness direction.

By configuring the optically-anisotropic layer as described above, a decrease in diffraction efficiency can be suppressed even in the region where the diffraction angle is large. As a result, the liquid crystal diffraction element where the diffraction efficiency is high irrespective of diffraction angles and the amount of transmitted light is uniform can be obtained. In addition, the wavelength dependence of the diffraction efficiency can be reduced, and light can be diffracted with the same diffraction efficiency irrespective of wavelengths.

Here, in the example shown in FIG. 10, the optically-anisotropic layer 26*b* has two inflection points where the tilt angle of each of the dark portions 44 changes. However, the present invention is not limited to this example, and each of the dark portions 44 may have one inflection point or may have three or more inflection points.

In addition, in the example shown in FIG. 10, in the optically-anisotropic layer 26*b*, shapes of the bright portions 42 and the dark portions 44 in the cross section of the radial center portion are symmetrical with respect to the center line of the optically-anisotropic layer 26*b* in the thickness direction, and shapes of the bright portions 42 and the dark portions 44 in the cross section of the radial end portion are asymmetrical with respect to the center line of the optically-anisotropic layer 26*b* in the thickness direction. That is, in the optically-anisotropic layer 26*b*, in the plane direction, the region where the shapes of the bright portions and the dark portions are symmetrical with respect to the center line of the thickness direction and the region where the shapes of the bright portions and the dark portions are asymmetrical with respect to the center line of the thickness direction are mixed.

However, the present invention is not limited to this configuration, and the optically-anisotropic layer may be asymmetrical with respect to the center line of the thickness direction over the entire region in the plane direction.

The exposure mask 10 is a liquid crystal diffraction element that includes the optically-anisotropic layer where the direction of the optical axis 30A derived from the liquid crystal compound 30 changes while continuously rotating in at least one in-plane direction.

However, in the exposure method according to the embodiment of the present invention, the exposure mask is not limited to the use of the liquid crystal diffraction element. That is, in the exposure method according to the embodiment of the present invention, various well-known members can be used as the exposure mask as long as they have the alignment pattern where the direction of the optical axis continuously changes in at least one in-plane direction.

For example, a metasurface can be used.

As described above, in the exposure method according to the embodiment of the present invention, the photosensitive coating film 14 including the photo-alignment material that is formed on the substrate 16 is exposed using, for example, the exposure mask 10 including the optically-anisotropic layer 26 as the liquid crystal diffraction element. With the exposure method according to the embodiment of the present invention, the liquid crystal alignment pattern in the exposure mask 10, that is, the optically-anisotropic layer 26 is formed on the coating film 14 as the alignment pattern, and the photoalignment layer is prepared on the substrate 16.

By forming an optically-anisotropic layer on the photoalignment layer prepared as described above using the liquid crystal composition, for example, as in the above-described optically-anisotropic layer 26, a transmissive liquid crystal diffraction element can be manufactured.

Alternatively, by adding the chiral agent to the liquid crystal composition, applying the liquid crystal composition to the photoalignment layer, and heating the liquid crystal compound such that the liquid crystal compound helically turns and is aligned in the thickness direction, a cholesteric liquid crystal layer that selectively reflects specific circularly polarized light in a specific wavelength range can be formed, and a reflective liquid crystal diffraction element can be manufactured.

Hereinabove, the exposure method of a photoalignment layer according to the embodiment of the present invention has been described in detail. However, the present invention is not limited to the above-described examples, and various improvements, modifications, and the like can be made within a range not departing from the scope of the present invention.

EXAMPLES

Hereinafter, the characteristics of the present invention will be described in detail using examples.

Materials, chemicals, used amounts, material amounts, ratios, treatment details, treatment procedures, and the like shown in the following examples can be appropriately changed within a range not departing from the scope of the present invention. Accordingly, the scope of the present invention is not limited to the following specific examples.

Comparative Example 1

<Preparation of Exposure Mask>

(Support)

A glass substrate was used as the support.

(Formation of Coating Film)

The following coating liquid for forming an alignment layer was applied to the support by spin coating. The support on which the coating film of the coating liquid for forming an alignment layer was formed was dried using a hot plate at 60 °C for 60 seconds. As a result, a coating film of the coating liquid for forming an alignment layer was formed.

Coating Liquid for Forming Alignment Layer

| | |
|---|---|
| Material A for photo-alignment | 1.00 part by mass |
| Water | 16.00 parts by mass |
| Butoxyethanol | 42.00 parts by mass |
| Propylene glycol monomethyl ether | 42.00 parts by mass |

—Material A for Photo-Alignment—

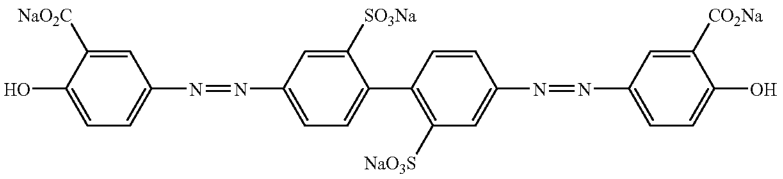

(Exposure of Coating film (Formation of Alignment Layer))

The coating film was exposed using the exposure device shown in FIG. 7 to form an alignment layer P-1 having an alignment pattern (concentric circular alignment pattern) where one direction in which a direction of an optical axis changed while continuously rotating was provided in a radial shape from a center toward an outer side as shown in FIG. 6. Hereinafter, this alignment pattern will also be referred to as a radial alignment pattern.

In the exposure device, a laser that emits laser light having a wavelength (325 nm) was used as the laser. The exposure amount of the interference light was 1000 mJ/cm$^2$. By using the exposure device shown in FIG. 7, the single period of the alignment pattern gradually decreased from the center toward the outer direction.

(Formation of Optically-Anisotropic Layer)

As a liquid crystal composition forming a first optically-anisotropic layer, the following composition A-1 was prepared.

Composition A-1

| | |
|---|---|
| Liquid crystal compound L-1 | 100.00 parts by mass |
| Polymerization initiator (Irgacure OXE01, manufactured by BASF SE) | 1.00 part by mass |
| Leveling agent T-1 | 0.08 parts by mass |
| Methyl ethyl ketone | 1050.00 parts by mass |

Liquid Crystal Compound L-1

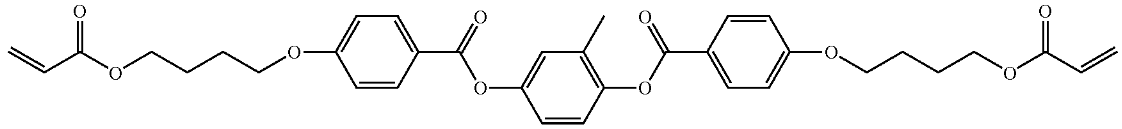

84%

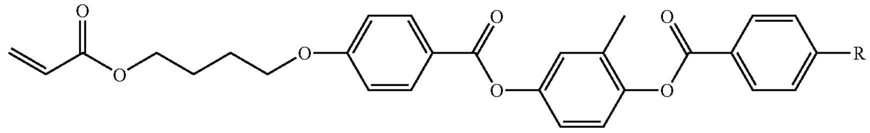

14%

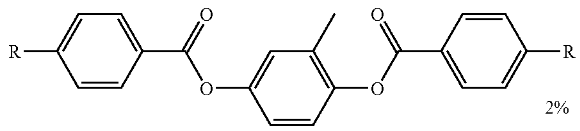

2%

R: 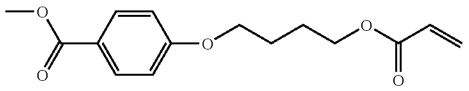

Leveling Agent T-1

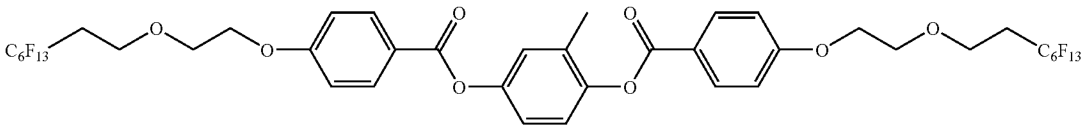

The optically-anisotropic layer was formed by applying multiple layers of the composition A-1 to the alignment layer P-1. The application of the multiple layers refers to repetition of the following processes including: preparing a first liquid crystal immobilized layer by applying the composition A-1 for forming the first layer to the alignment layer, heating the composition A-1, and irradiating the composition A-1 with ultraviolet light for curing; and preparing a second or subsequent liquid crystal immobilized layer by applying the composition A-1 for forming the second or subsequent layer to the formed liquid crystal immobilized layer, heating the composition A-1, and irradiating the composition A-1 with ultraviolet light for curing as described above. Even in a case where the liquid crystal layer was formed by the application of the multiple layers such that the total thickness of the optically-anisotropic layer was large, the alignment direction of the alignment layer was reflected from a lower surface of the optically-anisotropic layer to an upper surface thereof.

Regarding the first liquid crystal layer, the following composition A-1 was applied to the alignment layer P-1 to form a coating film, the coating film was heated to 80 °C using a hot plate, the coating film was irradiated with ultraviolet light having a wavelength of 365 nm at an irradiation dose of 300 mJ/cm$^2$ using a high pressure mercury lamp in a nitrogen atmosphere. As a result, the alignment of the liquid crystal compound was immobilized.

Regarding the second or subsequent liquid crystal immobilized layer, the composition was applied to the first liquid crystal layer, and the applied composition was heated and irradiated with ultraviolet light for curing under the same conditions as described above. As a result, a liquid crystal immobilized layer was prepared. This way, by repeating the application multiple times until the total thickness reached a desired film thickness, an optically-anisotropic layer was formed, and a liquid crystal diffraction element as an exposure mask was prepared.

A complex refractive index Δn of the cured layer of a composition A-1 was obtained by applying the composition A-1 a support with an alignment layer for retardation measurement that was prepared separately, aligning the director of the liquid crystal compound to be parallel to the substrate, irradiating the liquid crystal compound with ultraviolet irradiation for immobilization to obtain a liquid crystal immobilized layer (cured layer), and measuring the retardation value and the film thickness of the liquid crystal immobilized layer. An can be calculated by dividing the retardation value by the film thickness. The retardation value was measured by measuring a desired wavelength using Axoscan (manufactured by Axometrix inc.) and measuring the film thickness using an SEM.

Finally, in the optically-anisotropic layer, $\Delta n_{365}$×thickness (Re(365)) of the liquid crystals was 183 nm, and it was verified using a polarization microscope that the optically-anisotropic layer had a radial (concentric circular) periodically aligned surface as shown in FIG. 6.

In the liquid crystal alignment pattern of the optically-anisotropic layer, regarding the single period over which the optical axis of the liquid crystal compound rotated by 180°, the single period of a portion at a distance of about 3 mm from the center was 20 μm, and the single period of a portion at a distance of 25 mm from the center was 2 μm. This way, the single period decreased toward the outer direction. In addition, the twisted angle of the optically-anisotropic layer in the thickness direction was 0°.

Hereinafter, unless specified otherwise, "Δn×thickness" ("Δn×d") and the like were measured as described above.

In a cross-sectional SEM image obtained by observing a cross section of the prepared optically-anisotropic layer with an SEM, a pattern of bright portions and dark portions was observed. In the cross-sectional image obtained by the observation with the SEM, the pattern of the dark portion extended in the normal direction with respect to the main surface (the dark portion was not tilted with respect to the main surface).

<Preparation of Liquid Crystal Diffraction Element>

(Formation of Coating Film)

Using the same method as that of the preparation of the above-described exposure mask (liquid crystal diffraction element), a coating film of a coating liquid for forming an alignment layer was formed on the glass substrate.

(Exposure of Coating film (Formation of Photoalignment Layer))

Using the exposure device shown in FIG. 1, the coating film was exposed through the above-described exposure mask to form a photoalignment layer PA-1 having a concentric circular alignment pattern.

As the exposure device, a proximity exposure device emitting parallel light having a wavelength (365 nm) was used. The exposure amount was 1000 mJ/cm$^2$. Linearly polarized light (ellipticity <0.1) was incident into the exposure mask.

(Formation of Optically-Anisotropic Layer)

As a liquid crystal composition forming a first optically-anisotropic layer, the following composition B-1 was prepared.

Composition B-1

| | | |
|---|---|---|
| Liquid crystal compound L-1 | 100.00 | parts by mass |
| Chiral agent C-1 | 0.32 | parts by mass |
| Polymerization initiator (Irgacure OXE01, manufactured by BASF SE) | 1.00 | part by mass |
| Leveling agent T-1 | 0.08 | parts by mass |
| Methyl ethyl ketone | 1050.00 | parts by mass |

Chiral Agent C-1

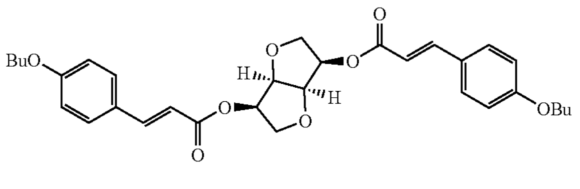

Leveling Agent T-1

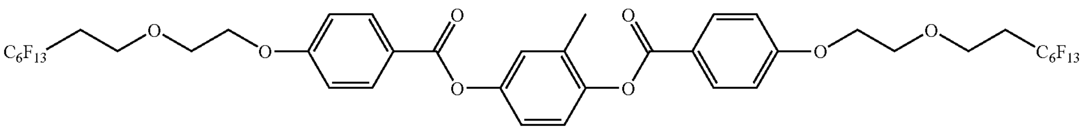

The first optically-anisotropic layer was formed by applying multiple layers of the composition B-1 to the photoalignment layer PA-1. The application of the multiple layers refers to repetition of the following processes including: preparing a first liquid crystal immobilized layer by applying the composition B-1 for forming the first layer to the alignment layer, heating the composition B-1, and irradiating the composition B-1 with ultraviolet light for curing; and preparing a second or subsequent liquid crystal immobilized layer by applying the composition B-1 for forming the second or subsequent layer to the formed liquid crystal immobilized layer, heating the composition B-1, and irradiating the composition B-1 with ultraviolet light for curing as described above. Even in a case where the liquid crystal layer was formed by the application of the multiple layers such that the total thickness of the optically-anisotropic layer was large, the alignment direction of the alignment layer was reflected from a lower surface of the optically-anisotropic layer to an upper surface thereof.

Regarding the first liquid crystal layer, the following composition B-1 was applied to the photoalignment layer PA-1 to form a coating film, the coating film was heated to 80 °C using a hot plate, the coating film was irradiated with ultraviolet light having a wavelength of 365 nm at an irradiation dose of 300 mJ/cm$^2$ using a high pressure mercury lamp in a nitrogen atmosphere. As a result, the alignment of the liquid crystal compound was immobilized.

Regarding the second or subsequent liquid crystal immobilized layer, the composition was applied to the first liquid crystal layer, and the applied composition was heated and irradiated with ultraviolet light for curing under the same conditions as described above. As a result, a liquid crystal immobilized layer was prepared. This way, by repeating the application multiple times until the total thickness reached a desired film thickness, a first optically-anisotropic layer was formed, and a liquid crystal diffraction element was prepared.

A complex refractive index Δn of the cured layer of a composition B-1 was obtained by applying the composition B-1 a support with an alignment layer for retardation measurement that was prepared separately, aligning the director of the liquid crystal compound to be parallel to the substrate, irradiating the liquid crystal compound with ultraviolet irradiation for immobilization to obtain a liquid crystal immobilized layer (cured layer), and measuring the retardation value and the film thickness of the liquid crystal immobilized layer. Δn can be calculated by dividing the retardation value by the film thickness. The retardation value was measured by measuring a desired wavelength using Axoscan (manufactured by Axometrix inc.) and measuring the film thickness using an SEM.

Finally, in the first optically-anisotropic layer, $\Delta n_{550}\times$ thickness (Re(550)) of the liquid crystals was 275 nm, and it was verified using a polarization microscope that the first optically-anisotropic layer had a radial (concentric circular) periodically aligned surface as shown in FIG. 6.

In the liquid crystal alignment pattern of the first optically-anisotropic layer, regarding the single period over which the optical axis of the liquid crystal compound rotated by 180°, the single period of a portion at a distance of about 3 mm from the center was 10 μm, and the single period of a portion at a distance of 25 mm from the center was 1 μm. This way, the single period decreased toward the outer direction. In addition, the twisted angle of the first optically-anisotropic layer in the thickness direction was left-twisted and) 70° (−70°.

As a liquid crystal composition forming a second optically-anisotropic layer, the following composition B-2 was prepared.

Composition B-2

| | | |
|---|---|---|
| Liquid crystal compound L-1 | 100.00 | parts by mass |
| Chiral agent C-2 | 0.18 | parts by mass |
| Polymerization initiator (Irgacure OXE01, manufactured by BASF SE) | 1.00 | part by mass |
| Leveling agent T-1 | 0.08 | parts by mass |
| Methyl ethyl ketone | 1050.00 | parts by mass |

Chiral Agent C-2

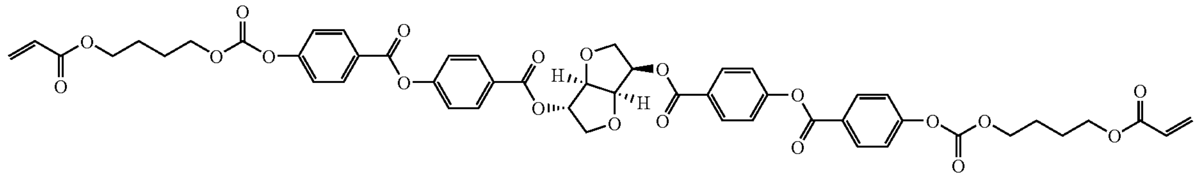 [SMILES: C=CC(=O)OCCCCOC(=O)Oc1ccc(C(=O)Oc2ccc(C(=O)O[C@H]3CO[C@H]4[C@@H]3OC[C@H]4OC(=O)c3ccc(OC(=O)c4ccc(OC(=O)OCCCCOC(=O)C=C)cc4)cc3)cc2)cc1]

A second optically-anisotropic layer was formed using the same method as that of the first optically-anisotropic layer, except that the film thickness of the optically-anisotropic layer was adjusted using the composition B-2.

Finally, in the second optically-anisotropic layer, $\Delta n_{550}\times$ thickness (Re(550)) of the liquid crystals was 275 nm, and it was verified using a polarization microscope that the second optically-anisotropic layer had a radial (concentric circular) periodically aligned surface as shown in FIG. 6. In the liquid crystal alignment pattern of the second optically-anisotropic layer, the period decreased toward the outer direction. The twisted angle in the thickness direction of the optically-anisotropic layer was right-twisted and 70°.

Example 1

<Preparation of Exposure Mask>

(Preparation of Substrate and Formation of Coating Film)

The same glass plate as that of Comparative Example 1 was used as a substrate, and a coating film of a coating liquid for forming an alignment layer was formed using the same method as that of Comparative Example 1.

(Exposure of Coating film (Formation of Photoalignment Layer))

The coating film was exposed to form a photoalignment layer P-2 having a concentric circular alignment pattern using the same method as that of Comparative Example 1, except that the focal length of a lens used for the exposure and the distance between the lens and the alignment layer were changed.

(Formation of Optically-Anisotropic Layer)

By forming first and second optically-anisotropic layers in the following procedure, a liquid crystal diffraction element as an exposure mask was prepared.

As a liquid crystal composition forming a first optically-anisotropic layer, the following composition A-2 was prepared.

Composition A-2

| | |
|---|---|
| Liquid crystal compound L-1 | 100.00 parts by mass |
| Chiral agent C-1 | 0.33 parts by mass |
| Polymerization initiator (Irgacure OXE01, manufactured by BASF SE) | 1.00 part by mass |
| Leveling agent T-1 | 0.20 parts by mass |
| Methyl ethyl ketone | 2000.00 parts by mass |

The first optically-anisotropic layer was formed by applying multiple layers of the composition A-2 to the alignment layer P-2.

Finally, in the first optically-anisotropic layer, $\Delta n_{365}\times$ thickness (Re(365)) of the liquid crystals was 183 nm, and it was verified using a polarization microscope that the first optically-anisotropic layer had a radial (concentric circular) periodically aligned surface as shown in FIG. 6.

In the liquid crystal alignment pattern of the optically-anisotropic layer, regarding the single period over which the optical axis of the liquid crystal compound rotated by 180°, the single period of a portion at a distance of about 3 mm from the center was 10 μm, and the single period of a portion at a distance of 25 mm from the center was 1 μm. This way, the single period decreased toward the outer direction. The twisted angle in the thickness direction of the optically-anisotropic layer was left-twisted and) 36° (−36°.

As a liquid crystal composition forming a second optically-anisotropic layer, the following composition A-3 was prepared.

Composition A-3

| | |
|---|---|
| Liquid crystal compound L-1 | 100.00 parts by mass |
| Chiral agent C-2 | 0.19 parts by mass |
| Polymerization initiator (Irgacure OXE01, manufactured by BASF SE) | 1.00 part by mass |
| Leveling agent T-1 | 0.20 parts by mass |
| Methyl ethyl ketone | 2000.00 parts by mass |

The second optically-anisotropic layer was formed by applying multiple layers of the composition A-3 to the first optically-anisotropic layer.

Finally, in the second optically-anisotropic layer, $\Delta n_{365}\times$ thickness (Re(365)) of the liquid crystals was 183 nm, and it was verified using a polarization microscope that the second optically-anisotropic layer had a radial (concentric circular) periodically aligned surface as shown in FIG. 6. In the liquid crystal alignment pattern of the optically-anisotropic layer, regarding the single period over which the optical axis of the liquid crystal compound rotated by 180°, the single period of a portion at a distance of about 3 mm from the center was 10 μm, and the single period of a portion at a distance of 25 mm from the center was 1 μm. This way, the single period decreased toward the outer direction. The twisted angle in the thickness direction of the optically-anisotropic layer was right-twisted and 36°.

In the first optically-anisotropic layer and the second optically-anisotropic layer, a retardation of the two layers was λ/4 wavelength (λ/4).

In a cross-sectional SEM image obtained by observing a cross section of the prepared optically-anisotropic layer with an SEM, a pattern of bright portions and dark portions was observed. In the cross-sectional image obtained by the observation with the SEM, the dark portion in the pattern of the dark portion was tilted with respect to the main surface. In addition, it was verified that the tilt direction of the dark portion was different from that of the first optically-anisotropic layer and the second optically-anisotropic layer, and the dark portion had one or more inflection points of angle.

The prepared optically-anisotropic layer had a region where shapes of the bright portion and the dark portion were symmetrical with respect to a center line in the thickness direction.

<Preparation of Liquid Crystal Diffraction Element>

(Formation of Photoalignment Layer)

An alignment layer (photoalignment layer) was formed on the glass substrate using the same method as that of the preparation of the exposure mask.

(Exposure of Photoalignment Layer)

Using the exposure device shown in FIG. 1, the photoalignment layer was exposed through the above-described exposure mask to form a photoalignment layer PA-2 having a concentric circular alignment pattern.

As the exposure device, a proximity exposure device emitting parallel light having a wavelength (365 nm) was used. The exposure amount was 1000 mJ/cm$^2$. Circularly polarized light (ellipticity 0.9 to 1.1) was incident into the exposure mask.

(Formation of Optically-Anisotropic Layer)

An optically-anisotropic layer was formed using the same method as that of the preparation of the liquid crystal diffraction element according to Comparative Example 1.

Finally, in the first optically-anisotropic layer, $\Delta n_{550}\times$ thickness (Re(550) of the liquid crystals was 275 nm, and it was verified using a polarization microscope that the first optically-anisotropic layer had a radial (concentric circular) periodically aligned surface as shown in FIG. 6. In the liquid crystal alignment pattern of the optically-anisotropic layer, regarding the single period over which the optical axis of the liquid crystal compound rotated by 180°, the single period of a portion at a distance of about 3 mm from the center was 10 μm, and the single period of a portion at a distance of 25 mm from the center was 1 μm. This way, the single period decreased toward the outer direction. The twisted angle in the thickness direction of the optically-anisotropic layer was left-twisted and) 70° (−70°.

Finally, in the second optically-anisotropic layer, $\Delta n_{550} \times$ thickness (Re(550)) of the liquid crystals was 275 nm, and it was verified using a polarization microscope that the second optically-anisotropic layer had a radial (concentric circular) periodically aligned surface as shown in FIG. 6. In the liquid crystal alignment pattern of the optically-anisotropic layer, the period decreased toward the outer direction. The twisted angle in the thickness direction of the optically-anisotropic layer was right-twisted and 70°.

[Evaluation]

<Evaluation of Exposure Mask>

An intensity ratio (zero-order light/first-order light) between zero-order light and first-order light of diffracted light emitted from the prepared exposure mask was evaluated. The measurement was performed by causing light to be vertically incident into the prepared exposure mask using a collimated light source having an output central wavelength of 365 nm. In this case, the intensities of the zero-order light and the first-order light of the diffracted light emitted from the exposure mask were measured using a photodetector.

Using the measured intensities of the zero-order light and the first-order light, an intensity ratio (zero-order light/first-order light) between the zero-order light and the first-order light was calculated. The measurement was performed by causing light to be vertically incident into the circularly polarizing plate corresponding to the wavelength of the light source to be converted into circularly polarized light and causing the circularly polarized light to be incident into the prepared exposure mask.

In Comparative Examples, the intensity ratio was evaluated at a position where the single period over which the optical axis of the liquid crystal compound rotated by 180° was 2 μm. In Examples, the intensity ratio was evaluated at a position where the single period over which the optical axis of the liquid crystal compound rotated by 180° was 1 μm.

The results are shown in Table 1.

TABLE 1

| | | Comparative Example 1 | Example 1 |
|---|---|---|---|
| Exposure Mask | Ellipticity of Incident Polarized Light | <0.1 | 0.9 to 1.1 |
| | Intensity Ratio of Diffracted Light Zero-Order Light/ First-Order Light | <0.3 | 0.8 to 1.2 |

<Evaluation of Alignment Pattern of Liquid Crystal Diffraction Element>

The polarization microscope image of the prepared liquid crystal diffraction element was evaluated. The liquid crystal alignment pattern where the single period over which the optical axis of the liquid crystal compound rotated by 180° was 1 μm was evaluated.

In a case where the liquid crystal alignment pattern of the liquid crystal diffraction element prepared in Comparative Example 1 was observed with a polarization microscope, distortion was observed in the pattern of bright and dark lines. On the other hand, in the liquid crystal diffraction element prepared in Example 1, the distortion of the bright and dark lines was improved.

<Evaluation of Diffraction Efficiency>

In a case where light was incident into the prepared liquid crystal diffraction element from the front (direction with an angle of 0° with respect to the normal line), the diffraction efficiency of emitted light was evaluated.

Specifically, laser light having an output central wavelength of 532 nm was emitted from the light source to be vertically incident into the prepared liquid crystal diffraction element.

In the emitted light from the liquid crystal diffraction element, the intensities of diffracted light (first-order light) diffracted in a desired direction, zero-order light (emitted in the same direction as incidence light) emitted in the other directions, and negative first-order light (light diffracted in a $-\theta$ direction in a case where the diffraction angle of first-order light with respect to zero-order light was represented by $\theta$) were measured using a photodetector, and the diffraction efficiency at each of the wavelengths was calculated from the following expression.

In the evaluation of the liquid crystal diffraction element, circularly polarized light was incident into a portion where the single period over which the optical axis of the liquid crystal compound rotated by 180° was 1 μm to perform the evaluation.

Diffraction Efficiency=First-Order Light/(First-Order Light+Zero-Order Light+(Negative First-Order Light))

As a result, in the liquid crystal diffraction element prepared in Example 1, the diffraction efficiency was improved by 5% or more as compared to Comparative Example 1.

As can be seen from the above results, the effects of the present invention are obvious.

EXPLANATION OF REFERENCES

10: exposure mask
12: light source
14: coating film
16: substrate
20: support
24: alignment layer
26, 26*a*, 26*b*: optically-anisotropic layer
30: liquid crystal compound
30A: optical axis
42: bright portion
44: dark portion
60: exposure device
62: laser
64: light source
65: λ/2 plate
68: polarization beam splitter
70A, 70B: mirror
72A, 72B: λ/4 plate
80: exposure device
82: laser
84: light source
86, 94: polarization beam splitter
90A, 90B: mirror
92: lens
96: λ/4 plate

What is claimed is:

1. An exposure method of a photoalignment layer, the exposure method comprising:

an exposure step of disposing an exposure mask and a substrate that includes a coating film including a compound having a photo-aligned group such that the exposure mask and the coating film face each other, irradiating the coating film with light to which the compound is photosensitive from the exposure mask side, and exposing the coating film to form an alignment pattern, wherein the light is circularly polarized light having an ellipticity of 0.7 to 1.3, the exposure mask is a polarization diffraction element having an alignment pattern where a direction of an optical axis changes while continuously rotating in at least one in-plane direction, in the exposure step, the coating film is exposed to zero-order light and first-order light of the light diffracted by the exposure mask, and an intensity ratio of the zero-order light to the first-order light is 0.5 to 2.

2. The exposure method of a photoalignment layer according to claim 1, wherein the zero-order light and the first-order light are circularly polarized light components having an ellipticity of 0.6 to 2, and the zero-order light and the first-order light are circularly polarized light components having opposite turning directions.

3. The exposure method of a photoalignment layer according to claim 2, wherein in the alignment pattern, in a case where a length over which the direction of the optical axis rotates by 180° in one in-plane direction is set as a single period, each of the exposure mask and the coating film to which the exposure step is applied has a region where a ratio of a length of the single period of the coating film to a length of the single period of the exposure mask is 0.7 to 1.5.

4. The exposure method of a photoalignment layer according to claim 2, wherein in the alignment pattern of the exposure mask, in a case where a length over which the direction of the optical axis rotates by 180° in a plane is set as a single period, the coating film to which the exposure step is applied has a region where the single period is 5 μm or less.

5. The exposure method of a photoalignment layer according to claim 2, wherein the exposure mask is a liquid crystal diffraction element including an optically-anisotropic layer that is formed of a liquid crystal composition including a liquid crystal compound, and the optically-anisotropic layer has a liquid crystal alignment pattern in which a direction of an optical axis derived from the liquid crystal compound changes while continuously rotating in at least one in-plane direction.

6. The exposure method of a photoalignment layer according to claim 5, wherein in an image obtained by observing a cross section of the optically-anisotropic layer taken in a thickness direction along the one in-plane direction with a scanning electron microscope, the optically-anisotropic layer has a bright portion and a dark portion extending from one main surface to another main surface, and has a region where the dark portion is tilted with respect to a main surface.

7. The exposure method of a photoalignment layer according to claim 6, wherein the optically-anisotropic layer has a region where an angle of the dark portion with respect to a perpendicular direction of a main surface of the optically-anisotropic layer varies in the thickness direction of the optically-anisotropic layer.

8. The exposure method of a photoalignment layer according to claim 1, wherein in the alignment pattern, in a case where a length over which the direction of the optical axis rotates by 180° in one in-plane direction is set as a single period, each of the exposure mask and the coating film to which the exposure step is applied has a region where a ratio of a length of the single period of the coating film to a length of the single period of the exposure mask is 0.7 to 1.5.

9. The exposure method of a photoalignment layer according to claim 1, wherein in the alignment pattern of the exposure mask, in a case where a length over which the direction of the optical axis rotates by 180° in a plane is set as a single period, the coating film to which the exposure step is applied has a region where the single period is 5 μm or less.

10. The exposure method of a photoalignment layer according to claim 1, wherein the exposure mask is a liquid crystal diffraction element including an optically-anisotropic layer that is formed of a liquid crystal composition including a liquid crystal compound, and the optically-anisotropic layer has a liquid crystal alignment pattern in which a direction of an optical axis derived from the liquid crystal compound changes while continuously rotating in at least one in-plane direction.

11. The exposure method of a photoalignment layer according to claim 10, wherein in an image obtained by observing a cross section of the optically-anisotropic layer taken in a thickness direction along the one in-plane direction with a scanning electron microscope, the optically-anisotropic layer has a bright portion and a dark portion extending from one main surface to another main surface, and has a region where the dark portion is tilted with respect to a main surface.

12. The exposure method of a photoalignment layer according to claim 11, wherein the optically-anisotropic layer has a region where an angle of the dark portion with respect to a perpendicular direction of a main surface of the optically-anisotropic layer varies in the thickness direction of the optically-anisotropic layer.

13. The exposure method of a photoalignment layer according to claim 12, wherein in the optically-anisotropic layer, the dark portion has one or more inflection points of angle.

14. The exposure method of a photoalignment layer according to claim 11, wherein in the optically-anisotropic layer, the dark portion has one or more inflection points of angle.

15. The exposure method of a photoalignment layer according to claim 14, wherein the dark portion has two or more inflection points of angle.

16. The exposure method of a photoalignment layer according to claim 11, wherein in a case where a length over which the direction of the optical axis rotates by 180° in one in-plane direction is set as a single period, the optically-anisotropic layer has a region where the single period decreases in the one in-plane direction in the liquid crystal alignment pattern, and the optically-anisotropic layer has a region where an angle of the dark portion with respect to a perpendicular direction of a main surface increases as the single period decreases.

17. The exposure method of a photoalignment layer according to claim 11, wherein the optically-anisotropic layer has a region where shapes of the bright portion and the dark portion are symmetrical with respect to a center line in the thickness direction.

18. The exposure method of a photoalignment layer according to claim 11, wherein the optically-anisotropic layer has a region where shapes of the bright portion and the dark portion are asymmetrical with respect to a center line in the thickness direction.

19. The exposure method of a photoalignment layer according to claim 1, wherein the alignment pattern of the exposure mask is a pattern where the one in-plane direction in which the direction of the optical axis changes while continuously rotating in the at least one in-plane direction is provided in a radial shape from a center toward an outer side.

20. A photoalignment layer which is manufactured using the exposure method of a photoalignment layer according to claim 1.

* * * * *